(12) United States Patent
Hwang et al.

(10) Patent No.: US 12,364,077 B2
(45) Date of Patent: Jul. 15, 2025

(54) MICRO LIGHT EMITTING DEVICE, DISPLAY APPARATUS INCLUDING THE SAME, AND METHOD OF MANUFACTURING THE MICRO LIGHT EMITTING DEVICE

(71) Applicant: SAMSUNG ELECTRONICS CO., LTD., Suwon-si (KR)

(72) Inventors: Junsik Hwang, Hwaseong-si (KR); Seogwoo Hong, Yongin-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 717 days.

(21) Appl. No.: 17/197,357

(22) Filed: Mar. 10, 2021

(65) Prior Publication Data

US 2022/0102602 A1 Mar. 31, 2022

(30) Foreign Application Priority Data

Sep. 25, 2020 (KR) .................. 10-2020-0124744

(51) Int. Cl.
*H01L 33/62* (2010.01)
*H01L 25/075* (2006.01)
*H01L 27/12* (2006.01)

(52) U.S. Cl.
CPC .......... *H01L 33/62* (2013.01); *H01L 25/0753* (2013.01); *H01L 27/1214* (2013.01); *H01L 2933/0066* (2013.01)

(58) Field of Classification Search
CPC ....... H01L 33/62; H01L 33/486; H01L 33/24; H01L 33/005; H01L 33/36; H01L 33/20;
(Continued)

(56) References Cited

U.S. PATENT DOCUMENTS 10,014,442 B2 7/2018 Kim et al.
10,586,787 B2 3/2020 Negley et al.
(Continued)

FOREIGN PATENT DOCUMENTS

CN 110416246 A 11/2019
EP 3 490 014 A1 5/2019
(Continued)

OTHER PUBLICATIONS

Communication dated Jan. 24, 2022 issued by the European Patent Office in application No. 21186957.3.
(Continued)

*Primary Examiner* — Cuong B Nguyen
*Assistant Examiner* — Anthony A Pulatov
(74) *Attorney, Agent, or Firm* — Sughrue Mion, PLLC

(57) ABSTRACT

A micro light emitting device, a display apparatus including the same, and a method of manufacturing the micro light emitting device are disclosed. The micro light emitting device includes a first type semiconductor layer; a light emitting layer provided on the first type semiconductor layer; a second type semiconductor layer provided on the light emitting layer; one or more first type electrodes provided on the second type semiconductor layer; one or more second type electrodes provided on the second type semiconductor layer and spaced apart from the one or more first type electrodes; and a bonding spread prevention portion provided between the one or more first type electrodes and the one or more second type electrodes.

23 Claims, 23 Drawing Sheets

(58) Field of Classification Search
CPC ......... H01L 33/00–648; H01L 25/0753; H01L 25/167; H01L 27/1214; H01L 27/15–156; H01L 2933/0066; H01L 2933/00–0091; H01L 2224/10145; G09F 9/33; H10K 2102/301; H10K 2102/341; H10K 2102/30; H10K 2102/361; H10K 2102/311; H10K 2101/00–80; H10K 71/831–861; H10K 71/00–441; H10K 77/10; H10K 77/111; H10K 85/00–761; H10K 59/00–88; H10K 59/80–8794; H10K 50/00–87; H10K 70/00; H10K 30/865

See application file for complete search history.

(56) References Cited

U.S. PATENT DOCUMENTS

| | | |
|---|---|---|
| 2014/0332828 A1 | 11/2014 | Hasenoehrl et al. |
| 2018/0351057 A1 | 12/2018 | Seo et al. |
| 2019/0115274 A1 | 4/2019 | Hu et al. |
| 2019/0165230 A1* | 5/2019 | Kim ........................ H01L 33/40 |
| 2019/0319015 A1* | 10/2019 | Schuele .............. H01L 25/0753 |
| 2020/0028028 A1* | 1/2020 | Tsai ........................ H01L 33/62 |
| 2020/0135999 A1 | 4/2020 | Daikoku et al. |
| 2020/0176508 A1 | 6/2020 | Wu et al. |
| 2021/0119079 A1 | 4/2021 | Hwang et al. |
| 2021/0159361 A1 | 5/2021 | Hwang et al. |
| 2021/0399167 A1* | 12/2021 | Baek ....................... H01L 33/24 |

FOREIGN PATENT DOCUMENTS

| | | |
|---|---|---|
| JP | 6660019 B2 | 3/2020 |
| KR | 101580213 B1 | 12/2015 |
| KR | 1020200049639 A | 5/2020 |
| KR | 1020210047695 A | 4/2021 |
| KR | 1020210064856 A | 6/2021 |

OTHER PUBLICATIONS

European Office Action issued in European Application No. 21186957.3; issued on Nov. 15, 2024.

* cited by examiner

MICRO LIGHT EMITTING DEVICE, DISPLAY APPARATUS INCLUDING THE SAME, AND METHOD OF MANUFACTURING THE MICRO LIGHT EMITTING DEVICE

CROSS-REFERENCE TO RELATED APPLICATION(S)

This application is based on and claims priority under 35 U.S.C. § 119 to Korean Patent Application No. 10-2020-0124744, filed on Sep. 25, 2020, in the Korean Intellectual Property Office, the disclosure of which is incorporated by reference herein in its entirety.

BACKGROUND

1. Field

Example embodiments relate to a micro light emitting device, a display apparatus including the micro light emitting device, and a method of manufacturing the micro light emitting device.

2. Description of Related Art

Light emitting diodes (LEDs) have the advantages of being eco-friendly and low power consumption. Due to these advantages, industrial demand therefor is increasing. LEDs are used not only for illumination apparatuses or LCD backlights, but also for LED display apparatuses. That is, display apparatuses using micro LED chips have been developed. In manufacturing micro LED display apparatuses, micro LEDs need to be transferred onto a substrate. A pick and place method is widely used as a method of transferring micro LEDs. However, according to this method, productivity is low as a size of the micro LED is reduced and a size of a display is increased.

In addition, as an area of a display apparatus is increased and the number of micro LEDs used for the display apparatus is increased and a size of the micro LED is reduced, many failures occur when a micro LED is bonded to a substrate.

SUMMARY

An example embodiment provides a micro light emitting device capable of reducing bonding failure.

An example embodiment provides a display apparatus including a micro light emitting device capable of reducing bonding failure.

An example embodiment provides a method of manufacturing a micro light emitting device capable of reducing bonding failure.

Additional aspects will be set forth in part in the description which follows and, in part, will be apparent from the description, or may be learned by practice of the presented embodiments of the disclosure.

According to an aspect of an example embodiment, a micro light emitting device includes a first type semiconductor layer; a light emitting layer provided on the first type semiconductor layer; a second type semiconductor layer provided on the light emitting layer; one or more first type electrodes provided on the second type semiconductor layer; one or more second type electrodes provided on the second type semiconductor layer and spaced apart from the one or more first type electrodes; and a bonding spread prevention portion provided between the one or more first type electrodes and the one or more second type electrodes.

The bonding spread prevention portion may include a valley structure or a damper structure.

The bonding spread prevention portion may include a trench or a hole configured to guide a flow of a bonding material.

The bonding spread prevention portion may include a protruding dam that is spaced apart from the one or more first type electrodes and the one or more second type electrodes.

The bonding spread prevention portion may further include a hole which contacts the one or more first type electrodes or the one or more second type electrodes.

The bonding spread prevention portion may include a hole which contacts the one or more first type electrodes or the one or more second type electrodes.

The one or more first type electrodes may be a p-type electrode, and the one or more second type electrodes may be an n-type electrode.

The one or more first type electrodes may be provided in a central region of the second type semiconductor layer, and the one or more second type electrodes may include a first electrode and a second electrode provided symmetrically with respect to the one or more first type electrodes.

The one or more second type electrodes may be provided in a central region of the second type semiconductor layer, and the one or more first type electrodes may include a first electrode and a second electrode provided symmetrically with respect to the one or more second type electrodes.

The one or more first type electrodes may be provided in a central region of the second type semiconductor layer, and the one or more second type electrodes may include a first electrode, a second electrode, a third electrode, and a fourth electrode provided symmetrically with respect to the one or more first type electrodes.

Two or more bonding spread prevention portions may be provided between the one or more first type electrodes and the one or more second type electrodes.

The micro light emitting device might have a rectangular, circular, or polygonal cross-sectional shape.

The micro light emitting device may include a dummy pattern at a position symmetrical to the one or more second type electrodes with respect to the one or more first type electrodes.

According to an example embodiment, a display apparatus may include a drive circuit substrate including a drive circuit, and a micro light emitting device provided on the drive circuit substrate, wherein the micro light emitting device may include a first type semiconductor layer; a light emitting layer provided on the first type semiconductor layer; a second type semiconductor layer provided on the light emitting layer; one or more first type electrodes provided on the second type semiconductor layer; one or more second type electrodes provided on the second type semiconductor layer and spaced apart from the one or more first type electrodes; and a bonding spread prevention portion provided between the one or more first type electrodes and the one or more second type electrodes.

The display apparatus may be included in a light emitting diode (LED) television, a mobile display, a smart watch, aggregated reality (AR) glasses, virtual reality (VR) glasses, a head-up display, or a signage.

According to an example embodiment, a method of manufacturing a micro light emitting device may include providing a first type semiconductor layer, a light emitting layer, and a second type semiconductor layer on a substrate;

forming a first pattern region and a second pattern region by etching the first type semiconductor layer, the light emitting layer, and the second type semiconductor layer by using a first mask; providing a first insulating layer on the second type semiconductor layer; forming a third pattern region and a fourth pattern region by etching the first insulating layer by using a second mask; forming a first type electrode by providing a metal layer in the third pattern region by using a third mask; forming a second type electrode by providing the metal layer in the fourth pattern region; and forming a bonding spread prevention portion in at least one of the first pattern region and the second pattern region between the first type electrode and the second type electrode by removing the third mask.

According to an aspect of an example embodiment, a micro light emitting device may include a first type semiconductor layer; a light emitting layer provided on the first type semiconductor layer; a second type semiconductor layer provided on the light emitting layer; a first type electrode provided on the second type semiconductor layer; a second type electrode provided on the second type semiconductor layer and spaced apart from the first type electrode; and a bonding spread prevention portion provided between the first type electrode and the second type electrode on the second type semiconductor layer such that a surface of the micro light emitting device between the first type electrode and the second type electrode is non-planar.

The bonding spread prevention portion is configured to prevent a flow of a bonding material from the first type electrode to the second type electrode.

The bonding spread prevention portion extends through the second type semiconductor layer and the light emitting layer.

The bonding spread prevention portion partially extends through the first type semiconductor layer.

The bonding spread prevention portion includes a valley structure including a base and sidewalls, and extends below the surface of the micro light emitting device between the first type electrode and the second type electrode is non-planar.

The bonding spread prevention portion includes a damper structure including a top and sidewalls, and extends above the surface of the micro light emitting device between the first type electrode and the second type electrode is non-planar.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
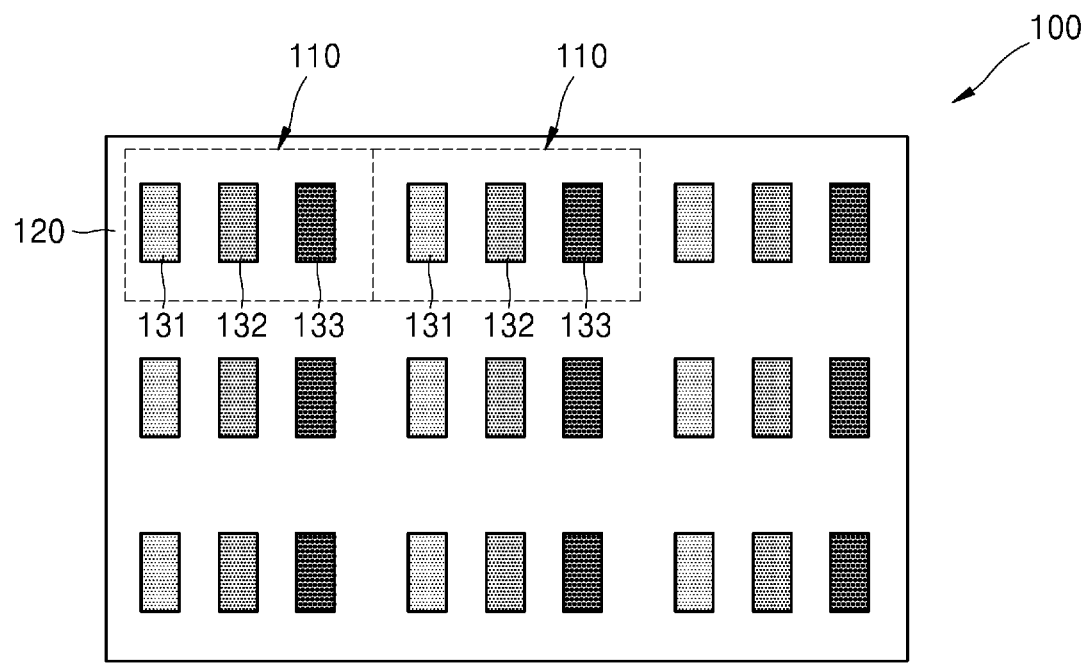
FIG. 1 is a schematic plan view of a display apparatus according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro light emitting device, a display apparatus, and a method of manufacturing the same according to various embodiments will be described in detail with reference to the accompanying drawings. In the drawings, like reference numerals refer to like elements, and a size of each element in the drawings may be exaggerated for clarity and convenience of description. The terms "first," "second," etc., may be used to describe various configuration elements but configuration elements should not be limited by terms. The foregoing terms are only used for the purpose of distinguishing one configuration element from another configuration element.

A singular expression includes plural expressions unless the context clearly indicates otherwise. In addition, when a part is described to "include" a certain configuration element, which means that the part may further include other configuration elements, except to exclude other configuration elements unless otherwise stated. In addition, in the drawings, a size or a thickness of each configuration element may be exaggerated for the sake of clear description. In addition, when it is described that a predetermined material layer is provided on a substrate or another layer, the material layer may also be provided in direct contact with the substrate or another layer, or a third layer may be provided therebetween. In addition, in the following examples, materials forming respective layers are examples, and other materials may be used.

In addition, terms such as "unit," "portion," and "module," described in the specification may indicate units that process at least one function or operation, which may be configured by hardware, software, or a combination of hardware and software.

Specific implementations described in the present embodiment are examples and do not limit the technical scope in any way. For the sake of brevity, descriptions of electronic configurations of the related art, control systems, software, and other functional aspects of the systems may be omitted. In addition, connection or connection members of lines between configuration elements illustrated in the drawings exemplarily represent functional connections and/or physical or circuit connections, and may be represented as alternative or additional various functional connections, physical connections, or circuit connections in an actual apparatus.

Use of a term "above-described" and a similar reference term may correspond to both the singular and the plural.

Steps constituting a method are not limited in the order described and may be performed in any suitable order unless there is a clear statement that the steps should be performed in the order described. In addition, use of all exemplary terms ("for example" and "or the like") is merely for describing technical ideas in detail, and the scope of the claims are not limited to the terms unless limited by claims.

FIG. 1 is a plan view of a display apparatus including a micro light emitting device according to an example embodiment.

Referring to FIG. 1, the display apparatus 100 may include a plurality of pixels 110. A plurality of pixels 110 may be arranged in a form of, for example, a two-dimensional matrix. The pixel 110 may include a plurality of sub-pixels.

The pixel 110 may represent a basic unit for displaying a color in the display apparatus 100. For example, one pixel 110 may include first color light, second color light, and third color light, and may display a color image by using the first color light to the third color light. For example, the first color light may include red light, the second color light may include green light, and the third color light may include blue light. However, the color light is not limited thereto. The pixel 110 may include a plurality of sub-pixels, each emitting color light. Each of the plurality of sub-pixels may be driven electrically and independently.

The pixel 110 may include a first micro light emitting device 131 that emits first color light, a second micro light emitting device 132 that emits second color light, and a third micro light emitting device 133 that emits third color light. The first micro light emitting device 131, the second micro light emitting device 132, and the third micro light emitting device 133 may be provided on a substrate 120. The substrate 120 may include a drive circuit that independently drives the first micro light emitting device 131, the second micro light emitting device 132, and the third micro light emitting device 133. The first micro light emitting device 131, the second micro light emitting device 132, and the third micro light emitting device 133 may emit lights of different colors. However, the present disclosure is not limited thereto, and the first micro light emitting device 131, the second micro light emitting device 132, and the third micro light emitting device 133 may emit color light having the same wavelength. In this case, a color conversion device may be further provided, which will be described below.

Figure 2:
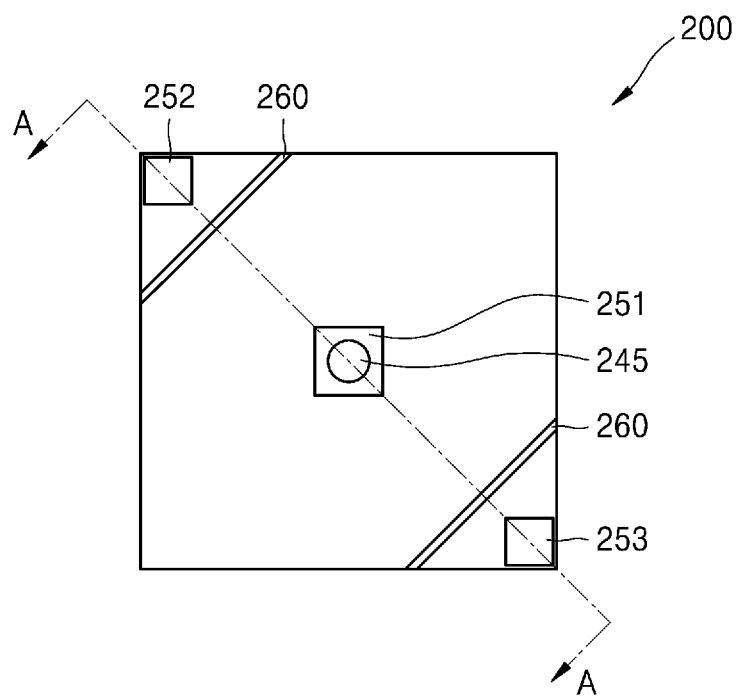
FIG. 2 is a plan view illustrating a micro light emitting device according to an example embodiment.
Figure 3:
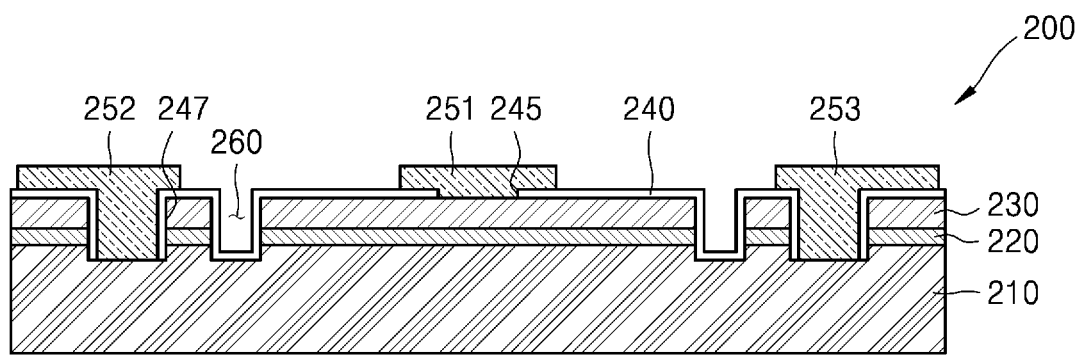
FIG. 3 is a cross-sectional view taken along line A-A of FIG. 2.

FIG. 2 is a plan view of a micro light emitting device according to an example embodiment, and FIG. 3 is a cross-sectional view taken along line A-A of FIG. 2.

Referring to FIGS. 2 and 3, the micro light emitting device 200 includes a first type semiconductor layer 210, a light emitting layer 220 provided on the first type semiconductor layer 210, a second type semiconductor layer 230, a first type electrode 251 provided on the second type semiconductor layer 230, and second type electrodes 252 and 253 provided in the second type semiconductor layer 230.

The first type semiconductor layer 210 may include, for example, an n-type semiconductor. The first type semiconductor layer 210 may include a III-V group n-type semiconductor, for example, n-GaN. Alternatively, the first type semiconductor layer 210 may include an AlN layer or an AlxGa(1-x)N (0≤x≤1) layer.

The light emitting layer 220 may generate light while electrons and holes are combined. The light emitting layer 220 may have a multi-quantum well (MQW) structure or a single-quantum well (SQW) structure. The light emitting layer 220 may include a III-V group semiconductor, for example, GaN. The light emitting layer 220 may have, for example, a multi-quantum well structure in which InGaN layers and GaN layers are alternately stacked.

The second type semiconductor layer 230 may include, for example, a p-type semiconductor layer. For example, a p-type dopant may include Mg, Ca, Zn, Cd, Hg, or the like. The first type semiconductor layer 210 and the second type semiconductor layer 230 may each have a single-layer structure or a multilayer structure. Alternatively, when the first type semiconductor layer 210 is a p-type semiconductor layer, the second type semiconductor layer 230 may be an n-type semiconductor layer. The second type semiconductor layer 230 may include, for example, a GaN layer, an AlN layer, or an AlxGa(1-x)N (0≤x≤1) layer.

The first type electrode 251 and the second type electrodes 252 and 253 may be arranged to be spaced apart from the second type semiconductor layer 230. The micro light emitting device 200 may have a horizontal electrode structure. For example, the first type electrode 251 may be a p-type electrode, and the second type electrodes 252 and 253 may be n-type electrodes. The micro light emitting device 200 may have, for example, a rectangular cross section. The first type electrode 251 may be provided in a central region of the second type semiconductor layer 230, and the second type electrodes 252 and 253 may be symmetrically arranged with respect to the second type semiconductor layer 230. In the present embodiment, two second type electrodes 252 and 253 are provided, and the two second type electrodes will be described as divided into a (2-1)th electrode 252 and a (2-2)th electrode 253 for the sake of convenient description. The first type electrode 251, the (2-1)th electrode 252, and the (2-2)th electrode 253 may be arranged in a rectangular diagonal direction. Arrangement positions of electrodes may be implemented in various ways, and an increased distance between the first type electrode 251 and the second type electrodes 252 and 253 may improve bonding. Because a size of the micro light emitting device is small, if the distance between the first type electrode 251 and the second type electrode 252, 253 is close, when the micro light emitting device is bonded to the substrate, a bonding material may flow to cause a short-circuit between electrodes. Thus, it may be better that the first type electrode 251 and the second type electrodes 252 and 253 are arranged so that a distance therebetween is far. However, the arrangement of the first type electrode 251 and the second type electrodes 252 and 253 is not limited thereto.

The first type electrode 251 and the second type electrodes 252 and 253 may be arranged on the same layer and have the same thickness. In addition, when the (2-1)th electrode 252 and the (2-2)th electrode 253 are symmetrically arranged on both sides of the first type electrode 251, a balance is achieved during bonding, thereby reducing a bonding failure.

An insulating layer 240 may be further provided on the second type semiconductor layer 230. The insulating layer 240 may include at least one of, for example, low-doped silicon, $SiO_2$, $Al_2O_3$, $HfO_2$, or $Si_3N_4$. A first hole 245 exposing the second type semiconductor layer 230 and a second hole 247 exposing the first type semiconductor layer 210 may be provided in the insulating layer 240. The second hole 247 may extend to the first type semiconductor layer 210 through the second type semiconductor layer 230 and the light emitting layer 220. The first type electrode 251 may be connected to the second type semiconductor layer 230 through the first hole 245. The second type electrodes 252 and 253 may be connected to the first type semiconductor layer 210 through the second hole 247.

Meanwhile, bonding spread prevention portions 260 may be provided between the first type electrode 251 and the second type electrodes 252 and 253. The bonding spread prevention portions 260 may be provided between the first type electrode 251 and the second type electrodes 252 and 253 on the second type semiconductor layer 230 such that a surface of the micro light emitting device between the first type electrode and the second type electrode is non-planar. For example, the top surface of the insulating layer 240 as shown in FIG. 3 is non-planar. The bonding spread prevention portion 260 may include, for example, a valley structure or a damper structure. In FIG. 3, the bonding spread prevention portion 260 may include a trench as an example of the valley structure. The valley structure may include a base and sidewalls, and extend below the surface of the micro light emitting device between the first type electrode 251 and the second type electrodes 252 and 253. Further, the bonding spread prevention portion 260 extends through the second type semiconductor layer 230 and the light emitting layer 220, and partially extends through the first type semiconductor layer 210. The bonding spread prevention portions 260 may be provided between the first type electrode 251 and the (2-1)th electrode 252 and between the first type electrode 251 and the (2-2)th electrode 253, respectively. The bonding spread prevention portions 260 may be provided to be spaced apart from the first type electrode 251, the (2-1)th electrode 252, and the (2-2)th electrode 253.

When the micro light emitting device 200 is bonded to the substrate 120 of FIG. 1, for example, eutectic bonding may be used. Then, while the first type electrode 251 and the second type electrodes 252 and 253 are melted, a bonding material may spread. In this case, the bonding material may flow into the bonding spread prevention portion 260. The bonding spread prevention portion 260 may induce the bonding material to flow to the bonding spread prevention portion 260. Accordingly, the bonding spread prevention portion 260 may prevent the first type electrode 251 and the second type electrodes 252 and 253 from being short-circuited due to spread of the bonding material and may reduce a bonding failure.

The bonding spread prevention portion 260 may be arranged between the first type electrode 251 and the second type electrodes 252 and 253 to cross a corner portion of the micro light emitting device 200. However, the arrangement of the bonding spread prevention portion 260 is not limited thereto, and the bonding spread prevention portion 260 may be provided in a partial region of a corner portion of the micro light emitting device 200. The bonding spread prevention portion 260 may be provided in a path between the first type electrode 251 and the second type electrodes 252 and 253 to prevent the first type electrode 251 and the second type electrodes 252 and 253 from being short-circuited due to spread of the melted bonding material when the first type electrode 251 is bonded to the second type electrodes 252 and 253.

As described above, the micro light emitting device 200 according to the example embodiment may prevent a bonding material from spreading during bonding even if a size of the micro light emitting device 200 is reduced, thereby increasing a bonding margin. Therefore, the bonding spread prevention portion 260 may contribute to reducing a size of the micro light emitting device 200. The micro light emitting device 200 may have, for example, a size less than or equal to 200 μm. Alternatively, the micro light emitting device 200 may have, for example, a size less than or equal to 100 μm.

The size of the micro light emitting device 200 may represent a maximum diameter in a cross section of the micro light emitting device 200. As illustrated in FIG. 2, when the micro light emitting device 200 has a rectangular cross section, a diagonal length may indicate a size of the micro light emitting device 200.

Figure 4:
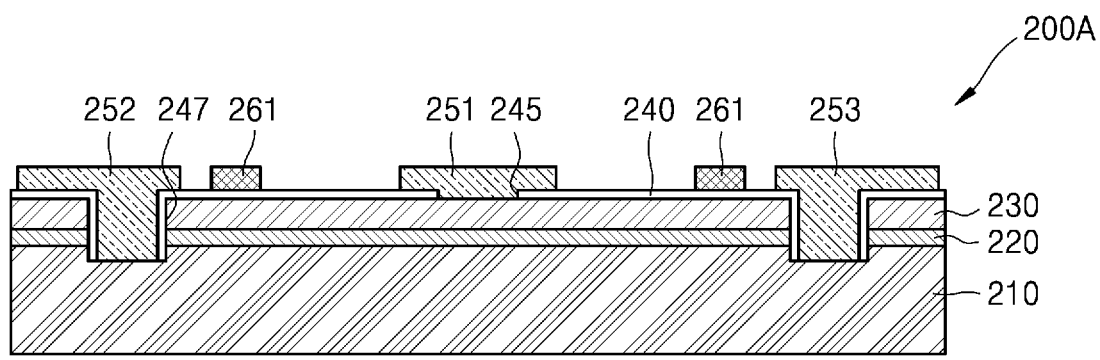
FIGS. 4 and 5 are cross-sectional views of another example of a micro light emitting device according to an example embodiment.

FIG. 4 illustrates another example of the micro light emitting device.

In FIG. 4, configuration elements denoted by the same reference numerals as the configuration elements of FIG. 3 are substantially the same as each other, and thus detailed descriptions thereof will be omitted. A micro light emitting device 200A may include bonding spread prevention portions 261 between the first type electrode 251 and the (2-1)th electrode 252 and between the first type electrode 251 and the (2-2)th electrode 253, respectively. The bonding spread prevention portions 261 may have a damper structure. For example, each of the bonding spread prevention portion 261 may include a protruding dam provided on the second type semiconductor layer 230. The damper structure may include a top and sidewalls, and extend above the surface of the micro light emitting device between the first type electrode 251 and the second type electrodes 252 and 253. The bonding spread prevention portions 261 may be provided to be spaced apart from the first type electrode 251 and the second type electrodes 252 and 253. Because the bonding spread prevention portions 261 are configured as protruding dams to block a flow of a bonding material to other electrodes during bonding, a bonding failure may be reduced. The bonding spread prevention portion 261 may have a height greater than or equal to heights of the first type electrode 251 and the second type electrodes 252 and 253.

Figure 5:
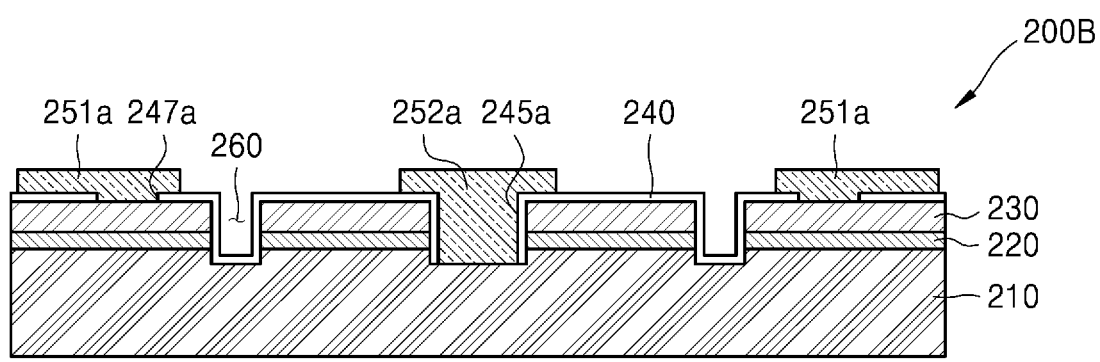

FIG. 5 illustrates another example of a micro light emitting device according to an example embodiment. FIG. 5 illustrates that positions of the first type electrode 251 and the second type electrodes 252 and 253 are changed as compared with FIG. 3. In FIG. 5, configuration elements denoted by the same reference numerals as in FIG. 3 are substantially the same as each other. Referring to FIG. 5, a micro light emitting device 200B may include a first type electrode 251a provided in a side region of the second type semiconductor layer 230, and a second type electrode 252a provided in a central region of the second type semiconductor layer 230. The first type electrode 251a may be a p-type electrode, and the second type electrode 252a may be an n-type electrode. A second hole 247a exposing the second type semiconductor layer 230 may be provided in the insulating layer 240, and a second hole 245a exposing the first type semiconductor layer 210 may be provided therein. The first type electrode 251a may be connected to the second type semiconductor layer 230 through the second hole 247a, and the second type electrode 252a may be connected to the first type semiconductor layer 210. In the present embodiment, the first type semiconductor layer 210 may be an n-type semiconductor layer, and the second type semiconductor layer 230 may be a p-type semiconductor layer. In this case, the bonding spread prevention portion 260 may be provided between the first type electrode 251a and the second type electrode 252a. The bonding spread prevention portion 260 may include a trench but may include a protruding dam without being limited thereto.

Figure 6:
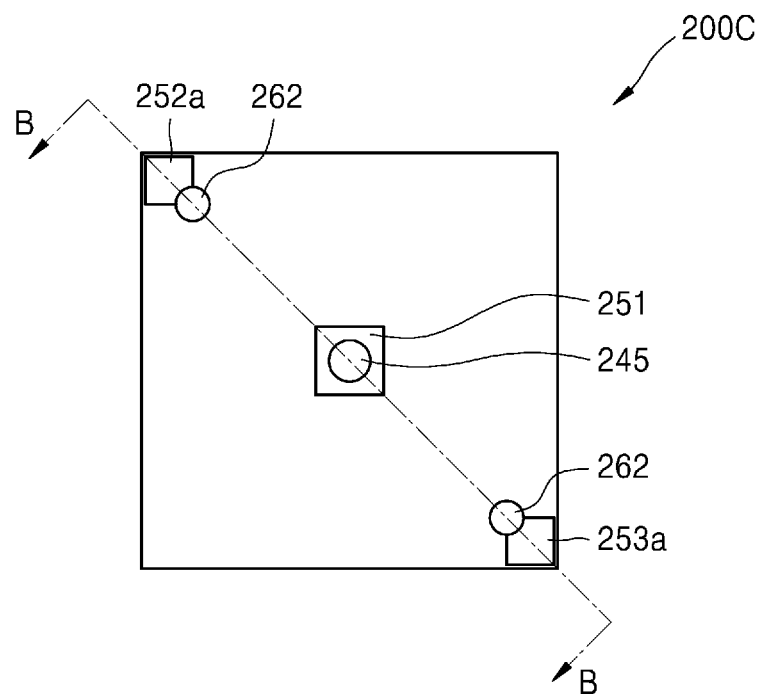
FIGS. 6 to 20 illustrate various examples of a bonding spread prevention portion of a micro light emitting device according to an example embodiment.
Figure 7:
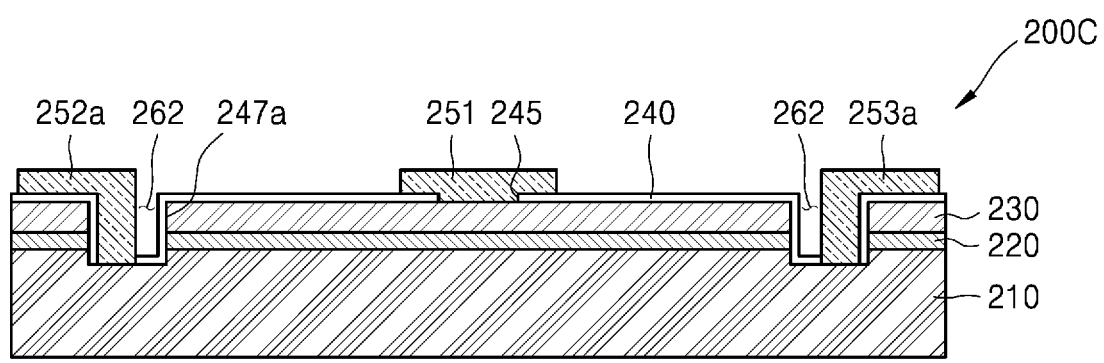

FIGS. 6 and 7 illustrate another example of a micro light emitting device according to an example embodiment. FIG. 7 is a cross-sectional view taken along line B-B of FIG. 6.

The micro light emitting device 200C may include the first type electrode 251, the second type electrodes 252a and 253a provided to be spaced apart from the first type electrode 251, and the bonding spread prevention portion 262 provided between the first type electrode 251 and the second type electrodes 252a and 253a.

The first type electrode 251 may be provided in a central region of the second type semiconductor layer 230, and the second type electrodes 252a and 253a may be provided in side regions of the second type semiconductor layer 230. The bonding spread prevention portion 262 may include holes in contact with the second type electrodes 252a and 253a.

A second hole 247a may be provided to extend to the first type semiconductor layer 210 through the second type semiconductor layer 230 and the light emitting layer 220, and the second type electrode 252a may be provided in some of the second hole 247a. The second hole 247a may communicate with the bonding spread prevention portion 262. The second hole 247a may expose the first type semiconductor layer 210, and the second type electrodes 252a and 253a may be connected to the first type semiconductor layer 210 through the second hole 247a.

When the second type electrodes 252a and 253a are melted and flow during bonding of the micro light emitting device, a bonding material may be induced to flow into the bonding spread prevention portion 262. Accordingly, a bonding failure may be prevented by blocking a material that is melted and spread in the second type electrodes 252a and 253a. In the present embodiment, the bonding spread prevention portions 262 are in contact with the second type electrodes 252a and 253a, and thus, the bonding spread prevention portions 262 may prevent a bonding material from spreading due to the second type electrodes 252a and 253a, and also, distances between the first type electrode 251 and the bonding spread prevention portions 262 are relatively far compared to the distances in the embodiment illustrated in FIG. 2, and thus, a relatively large bonding margin of the first type electrode 251 may be obtained.

FIG. 6 illustrates an example in which each of the bonding spread prevention portions 262 has a circular cross section, but the cross-sectional shapes of the bonding spread prevention portion 262 may be various. For example, the bonding spread prevention portions 262 may have various shapes, such as a polygonal cross section including a rectangular cross section. The bonding spread prevention portions 262 may be arranged on lines connecting the first type electrode 251 to the second type electrodes 252a and 253a. However, positions of the bonding spread prevention portion 262 are not limited thereto, and the bonding spread prevention portions 262 may also be arranged in regions outside the lines connecting the first type electrode 251 to the second type electrodes 252a and 253a. In the present embodiment, the bonding spread prevention portions 262 are in contact with the second type electrodes 252a and 253a and may have various positions, but even in this case, the bonding spread prevention portion 262 may be provided between the first type electrode 251 and the second type electrodes 252a and 253a.

Figure 8:
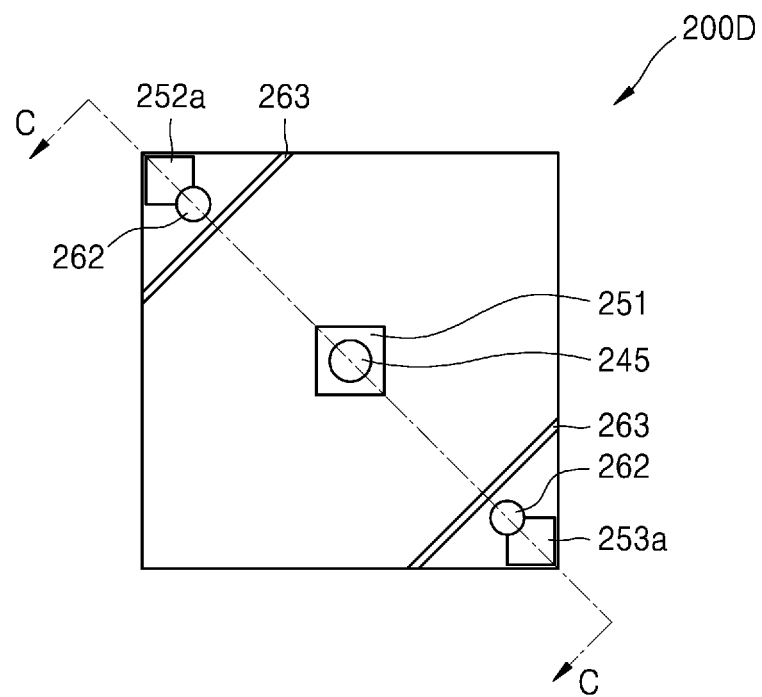
Figure 9:
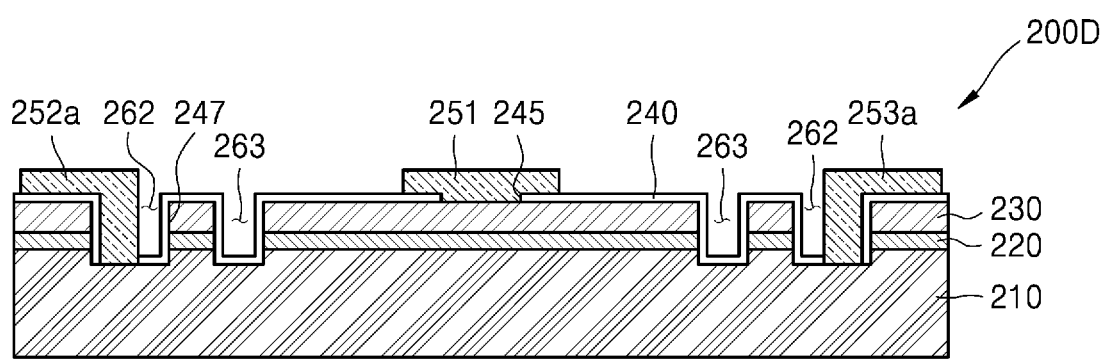

FIGS. 8 and 9 illustrate another example of a micro light emitting device according to an example embodiment. FIG. 9 is a cross-sectional view taken along line C-C of FIG. 8.

A micro light emitting device 200D illustrates an example in which two bonding spread prevention portions are provided. The bonding spread prevention portions 262 and 263 may include holes and trenches. As compared with FIG. 7, a second bonding spread prevention portion 263 including a trench is further provided in the first bonding spread prevention portion 262 including a hole. The first bonding spread prevention portions 262 may be in contact with the second type electrodes 252a and 253a, and the second bonding spread prevention portions 263 may be spaced apart from the first type electrode 251 and the second type electrodes 252a and 253a. The first bonding spread prevention portions 262 may include cylindrical holes but may be provided as trenches. Each of the second bonding spread prevention portions 263 may include a trench but may also include a cylindrical hole, a rectangular hole, a polygonal hole, or the like.

In this way, when two bonding spread prevention portions 262 and 263 are provided between the first type electrode 251 and the second type electrodes 252a and 253a, a bonding failure due to bonding spread may be prevented more reliably from occurring.

Meanwhile, a case in which a micro light emitting device has a rectangular cross-sectional shape is described so far, but the micro light emitting device may have various cross-sectional shapes.

Figure 10:
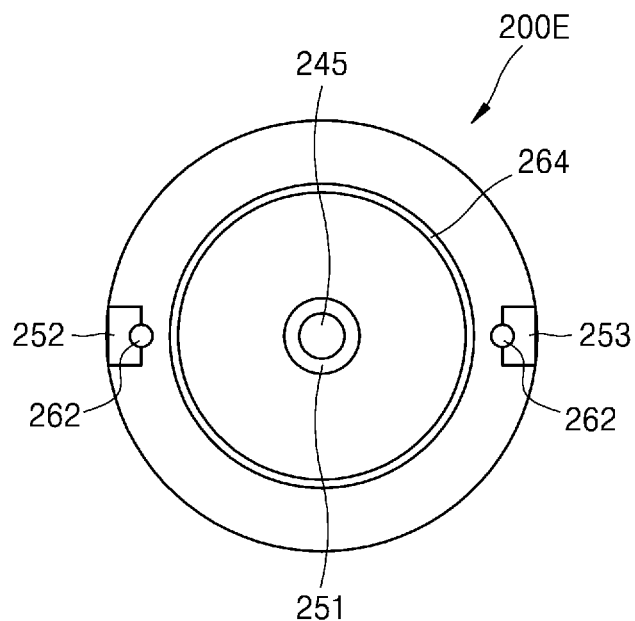

FIG. 10 illustrates an example in which a micro light emitting device has a circular cross section. A micro light emitting device 200E may include the first bonding spread prevention portion 262 and a second bonding spread prevention portion 264 between the first type electrode 251 and the second type electrodes 252 and 253. The first bonding spread prevention portion 262 may include a hole or a trench provided in contact with the second type electrodes 252 and 253. The second bonding spread prevention portion 264 may include a trench. The second bonding spread prevention portion 264 may be provided to have a closed loop shape around the first type electrode 251. For example, the second bonding spread prevention portion 264 may have a circular loop shape centered on the first type electrode 251. However, the shape or structure of the second bonding spread prevention portion 264 is not limited thereto, and the second bonding spread prevention portion 264 may have a square shape or a polygonal shape or may be provided in an open shape rather than a closed shape. This will be described below. In addition, the second bonding spread prevention portion 264 may include a damper structure such as, for example, a protruding dam.

Figure 11:
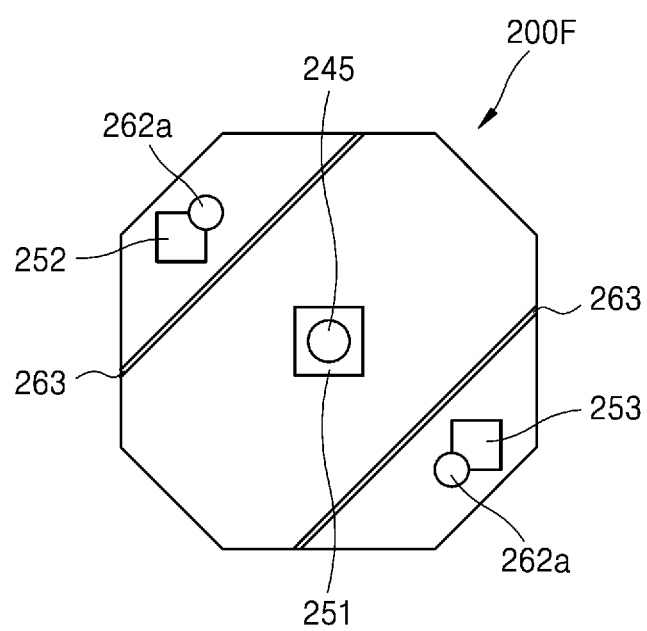

FIG. 11 illustrates an example in which a micro light emitting device has an octagonal cross section. A micro light emitting device 200F may include first bonding spread prevention portions 262a and the second bonding spread prevention portions 263 between the first type electrode 251 and the second type electrodes 252 and 253. The first bonding spread prevention portions 262a may include holes provided in contact with the second type electrodes 252 and 253. The first bonding spread prevention portions 262a may be provided outside lines connecting the first type electrode 251 to the second type electrodes 252 and 253. The second bonding spread prevention portions 263 may be provided in a trench shape and may be provided in parallel with corners of the octagonal cross section. The second bonding spread prevention portions 263 may be provided relatively closer to the second type electrodes 252 and 253 than the first type electrode 251. However, the second bonding spread prevention portions are not limited thereto.

Figure 12:
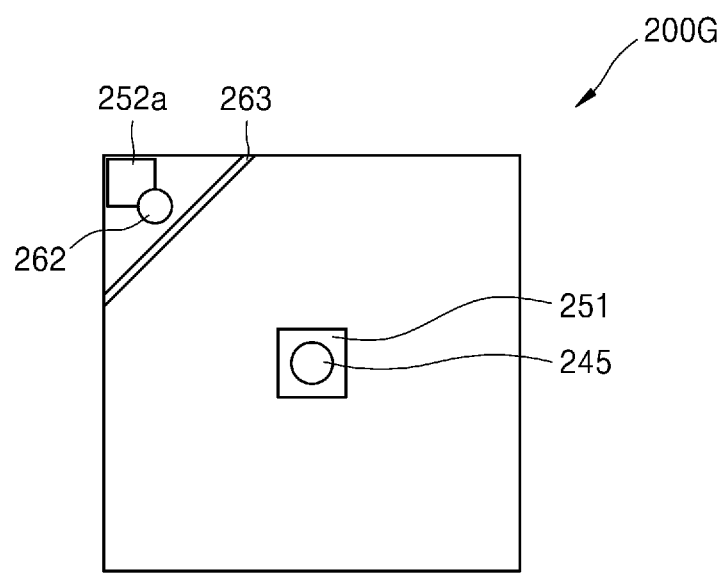

FIG. 12 illustrates another example of a micro light emitting device.

A micro light emitting device 200G may include the first type electrode 251 and the second type electrode 252a. The first type electrode 251 may be provided in a central region of the micro light emitting device 200G, and the second type electrode 252a may be provided at one corner of the micro light emitting device 200G. In the present embodiment, one second type electrode 252a may be provided. The first bonding spread prevention portion 262 and the second bonding spread prevention portion 263 may be provided between the first type electrode 251 and the second type electrode 252a.

Figure 13:
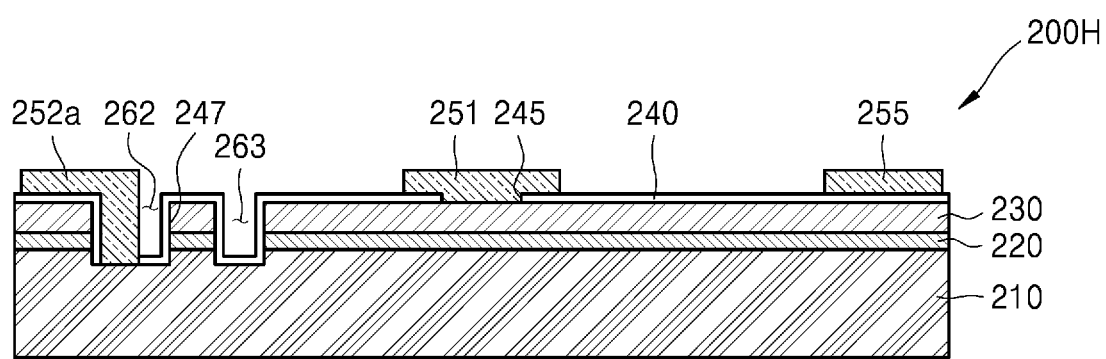

FIG. 13 illustrates another micro light emitting device.

A micro light emitting device 200H may include the first type electrode 251 and the second type electrode 252a, and the second type electrode 252a may be provided on one side of the first type electrode 251. In addition, a dummy pattern 255 may be further provided. For example, the dummy pattern 255 may be provided on the other side of the first type electrode 251. The dummy pattern 255 may be provided at a position symmetrical to the second type electrode 252a around the first type electrode 251. The dummy pattern 255 may have the same thickness as, for example, the first type electrode 251 and the second type electrode 252a. The dummy pattern 255 may have the same thickness as the second type electrode 252a and arranged in a position symmetrical thereto to balance the micro light emitting device 200H during bonding so as not to be inclined.

Figure 14:
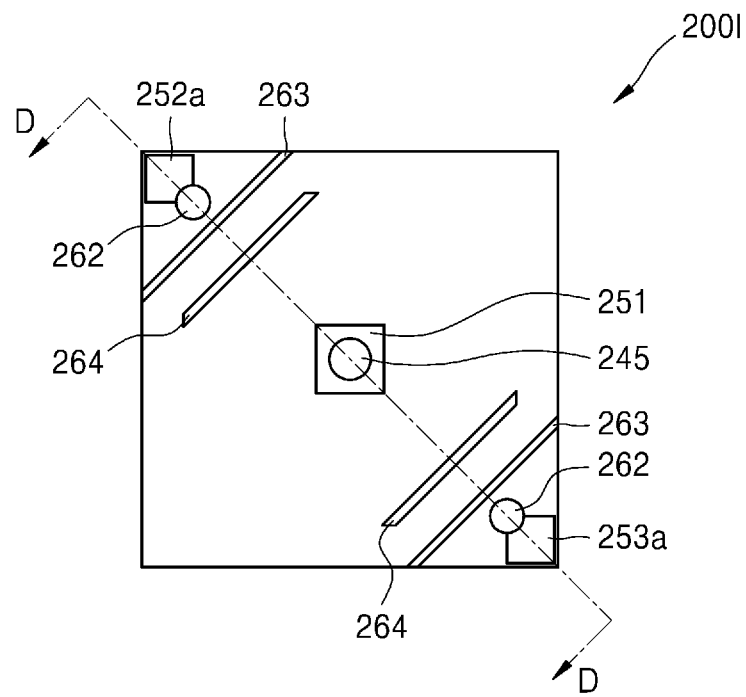
Figure 15:
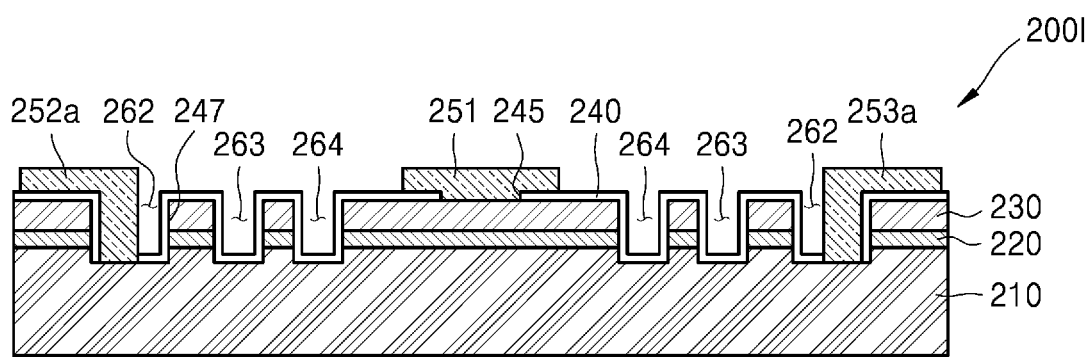

FIGS. 14 and 15 illustrate another example of a micro light emitting device according to an example embodiment. FIG. 15 is a cross-sectional view taken along line D-D in FIG. 14.

A micro light emitting device 200I may include first bonding spread prevention portions 262, second bonding spread prevention portions 263, and third bonding spread prevention portions 264, which are provided between the first type electrode 251 and the second type electrodes 252a and 253a. The first bonding spread prevention portions 262 and the second bonding spread prevention portions 263 are the same as the bonding spread prevention portions described with reference to FIG. 9, and thus, detailed description thereof is omitted here. The third bonding spread prevention portions 264 may be further provided between the second bonding spread prevention portions 263 and the first type electrode 251 and may be provided in, for example, a trench shape. The third bonding spread prevention portions 264 may be provided in partial regions of corners of the micro light emitting device 200I or may be provided across the entire region. The second bonding spread prevention portions 263 and the third bonding spread prevention portions 264 may each be configured with an appropriate combination of a damper structure and a valley structure, and positions and sizes thereof may be variously adjusted. For example, the first bonding spread prevention portions 262, the second bonding spread prevention portions 263, and the third bonding spread prevention portions 264 may have the same depth. However, the bonding spread prevention portions are not limited thereto.

FIGS. 16 to 20 illustrate examples of various arrangements, shapes, and structures of a bonding spread prevention portion.

Figure 16:
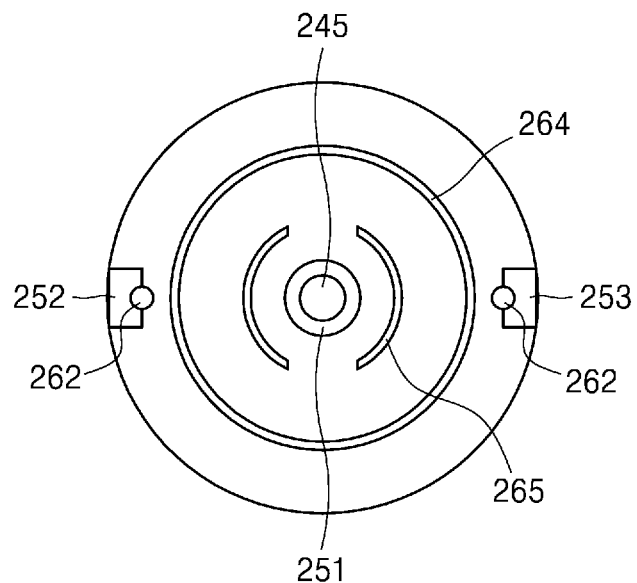

Referring to FIG. 16, a micro light emitting device may have a circular cross-sectional shape and may include first bonding spread prevention portions 262, a second bonding spread prevention portion 264, and third bonding spread prevention portions 265 between the first type electrode 251 and the second type electrodes 252 and 253. The first bonding spread prevention portions 262 may include holes provided in contact with the second type electrodes 252 and 253, and the second bonding spread prevention portion 264 may include a circular closed loop type trench or a dam provided around the first type electrode 251. The third bonding spread prevention portions 265 may be provided between the second bonding spread prevention portion 264 and the first type electrode 251 and may have curved-shape type trenches or dams symmetrically arranged around the first type electrode 251. The third bonding spread prevention portions 265 are not limited to a curved shape but may be provided in a straight shape and may have various shapes.

Figure 17:
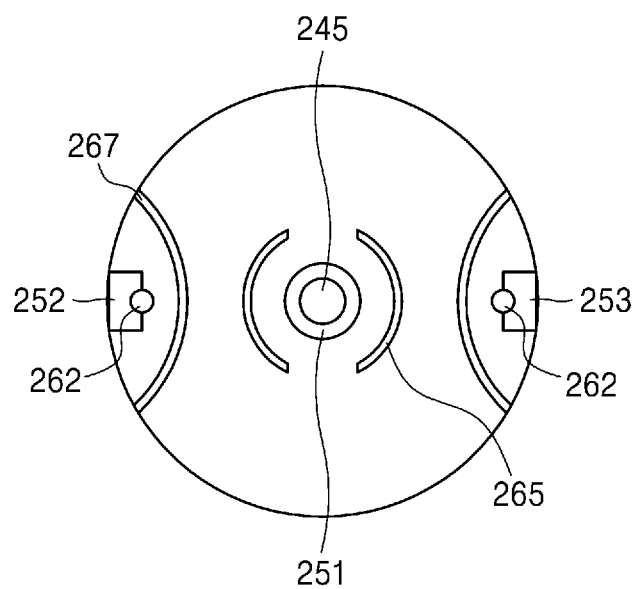

Referring to FIG. 17, the micro light emitting device may have a circular cross-sectional shape and may include the first bonding spread prevention portions 262, second bonding spread prevention portions 267, and the third bonding spread prevention portions 265 between the first type electrode 251 and the second type electrodes 252 and 253. The second bonding spread prevention portions 267 may include trenches or protruding dams having concave curved shapes toward the second type electrodes 252 and 253. The third bonding spread prevention portions 265 may include trenches or protruding dams having a concave curved shape toward the first type electrode 251. Alternatively, the third bonding spread prevention portions 265 may have a circular shape.

Figure 18:
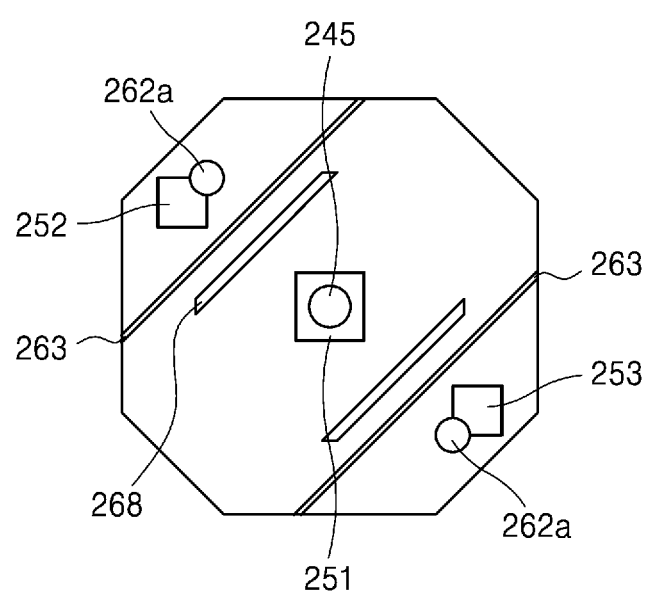

Referring to FIG. 18, the micro light emitting device may have an octagonal cross-sectional shape and may include first bonding spread prevention portions 262a, second bonding spread prevention portions 263, and third bonding spread prevention portions 268 between the first type electrode 251 and the second type electrodes 252 and 253. The second type electrodes 252 and 253 may be provided adjacent to opposite corners of an octagon, and the first bonding spread prevention portions 262a may be provided in contact with the second type electrodes 252 and 253. The second bonding spread prevention portions 263 and the third bonding spread prevention portions 268 may include, for example, trenches or protruding dams provided in parallel to the corners. For example, lengths of the second bonding spread prevention portions 263 and the third bonding spread prevention portions 268 may be various.

Figure 19:
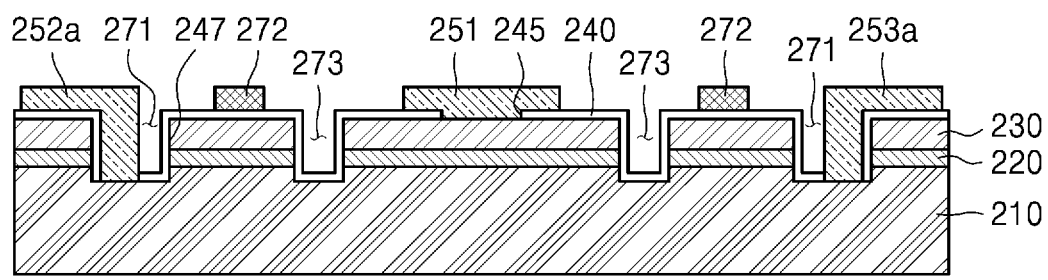

Referring to FIG. 19, a micro light emitting device may include first bonding spread prevention portions 271, second bonding spread prevention portions 272, and third bonding spread prevention portions 273 between the first type electrode 251 and the second type electrodes 252a and 253a. The first bonding spread prevention portions 271 may include holes provided in contact with the first type electrode 251 and the second type electrodes 252a and 253a. The second bonding spread prevention portions 272 may include protruding dams. The third bonding spread prevention portions 273 may include trenches or holes.

Figure 20:
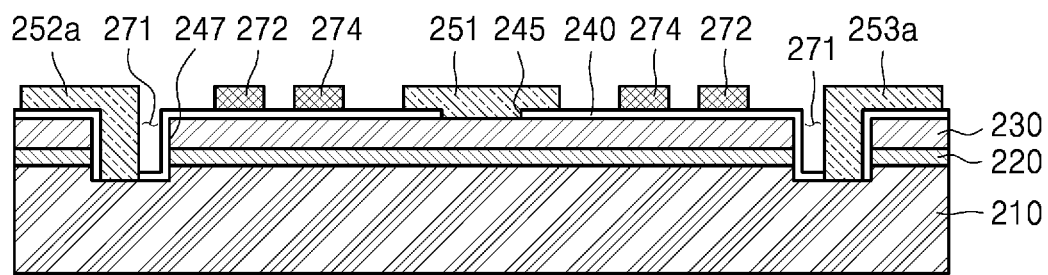

Referring to FIG. 20, protruding dams may be included in third bonding spread prevention portions 274 instead of the third bonding spread prevention portions 273 of the micro light emitting device illustrated in FIG. 19. In this way, in an example embodiment, the number of bonding spread prevention portions, damper structures, and valley structures may be variously combined. In addition, positions of the first type electrode and the second type electrode may be switched, and the second type electrode and the dummy pattern may be mixed with each other.

FIGS. 21 to 24 illustrate examples in which four second type electrodes are provided.

Figure 21:
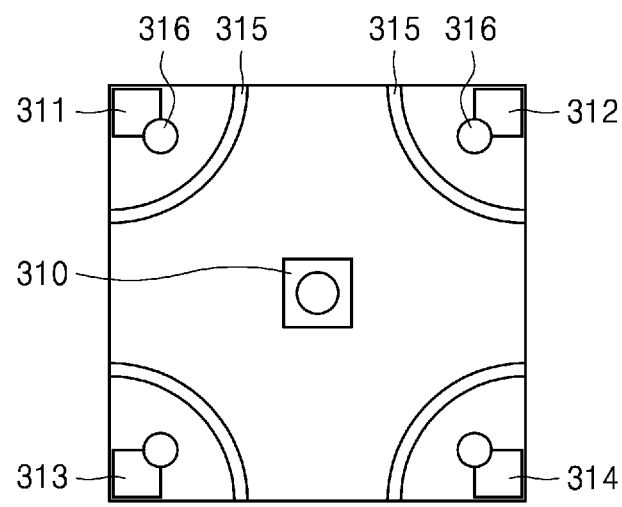
FIGS. 21 to 24 illustrate various examples of an electrode structure and a bonding spread prevention portion of a micro light emitting device according to an example embodiment.

Referring to FIG. 21, a micro light emitting device may include a first type electrode 310 and second type electrodes. The second type electrodes may include, for example, a (2-1)th electrode 311, a (2-2)th electrode 312, a (2-3)th electrode 313, and a (2-4)th electrode 314. The first type electrode 310 may be, for example, a p-type electrode, and the (2-1)th electrode 311, the (2-2)th electrode 312, the (2-3)th electrode 313, and the (2-4)th electrode 314 may be n-type electrodes. First bonding spread prevention portions 315 and second bonding spread prevention portions 316 may be provided between the first type electrode 310 and the (2-1)th electrode 311, between the first type electrode 310 and the (2-2)th electrode 312, the first type electrode 310 and the (2-3)th electrode 313, and between the first type electrode 310 and the (2-4)th electrode 314, respectively. Each of the first bonding spread prevention portions 315 may include a trench or a protruding dam having a convex curved shape toward the first type electrode 310. Each of the second bonding spread prevention portion 316 may include a hole or trench in contact with each second type electrode corresponding thereto.

Figure 22:
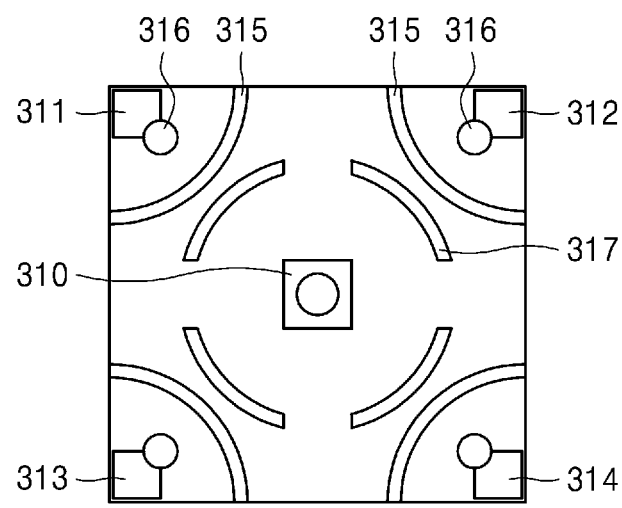

Referring to FIG. 22, third bonding spread prevention portions 317 may be further provided in the micro light emitting device illustrated in FIG. 21. The third bonding spread prevention portions 317 may have concave curved shapes toward the first type electrode 310. Alternatively, the third bonding spread prevention portions 317 may also have a convex curved shape toward the first type electrode 310. Alternatively, the third bonding spread prevention portions 317 may each have a circular shape. FIGS. 21 and 22 illustrate examples in which the micro light emitting device has a rectangular cross-sectional shape.

Figure 23:
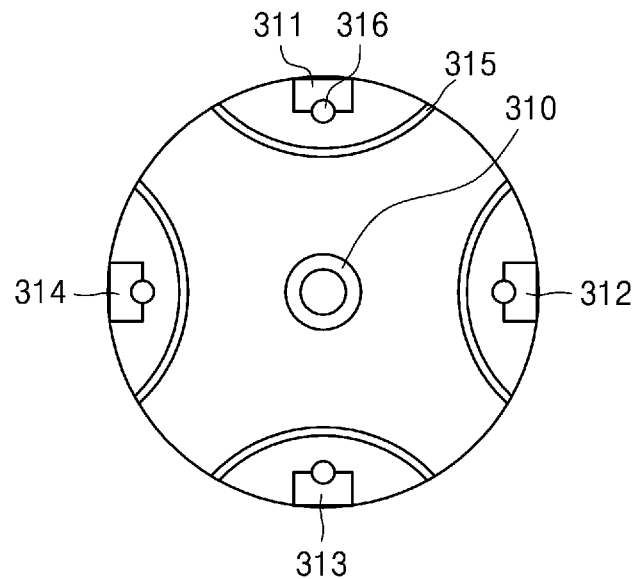
Figure 24:
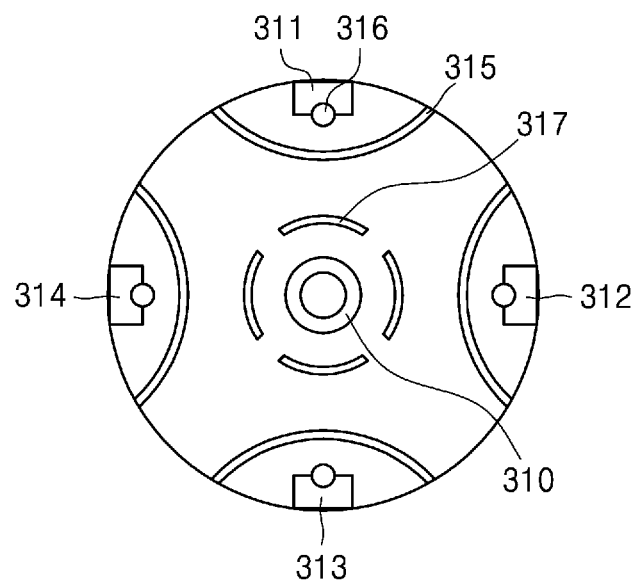

FIGS. 23 and 24 illustrate examples in which four second type electrodes are provided in a micro light emitting device having a circular cross section. When comparing FIGS. 23 and 24 with FIGS. 21 and 22, there is a difference in that a micro light emitting device has a circular cross section, and the remaining configuration elements may be applied in the same manner, and thus, detailed description thereof is omitted here.

Figure 25:
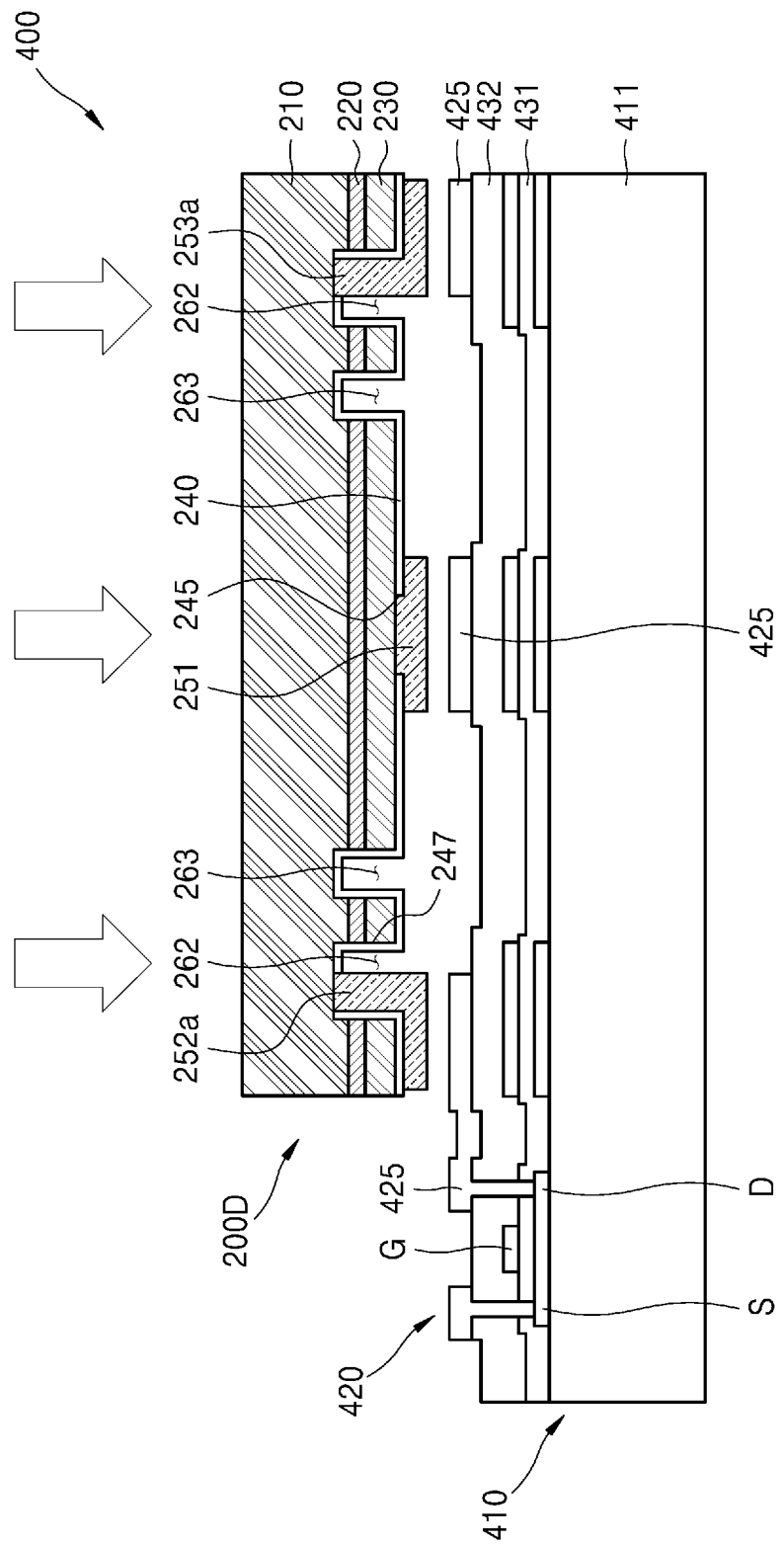
FIG. 25 illustrates a display apparatus according to an example embodiment.

FIG. 25 illustrates a display apparatus according to an example embodiment.

A display apparatus 400 may include a drive circuit substrate 410 and a micro light emitting device 200D provided on the drive circuit substrate 410.

The drive circuit substrate 410 may include at least one transistor and at least one capacitor capable of driving the micro light emitting device 200D. The drive circuit substrate 410 may include, for example, a switch transistor, a drive transistor, and a capacitor. However, the drive circuit substrate 410 is not limited thereto and may include one transistor and one capacitor. The drive circuit substrate 410 may include, for example, a complementary metal oxide semiconductor (CMOS) backplane or a display panel. However, the drive circuit substrate 410 is not limited thereto.

The drive circuit substrate 410 may include a substrate 411 and a transistor 420 provided on the substrate 411. The substrate 411 may include, for example, a glass substrate. The transistor 420 may include a source electrode S, a drain electrode D, and a gate electrode G. A metal layer 425 electrically connected to the source electrode S and the drain electrode D may be provided. The metal layer 425 may include wiring lines. At least one insulating layer may be provided on the substrate 411. For example, at least one insulating layer may include a first insulating layer 431 and a second insulating layer 432.

The micro light emitting device 200D is the same as the micro light emitting device described with reference to FIG. 9, and thus, detailed description thereof is omitted here. The micro light emitting device 200D illustrated in FIG. 9 may be turned over and coupled to the drive circuit substrate 410. The first type electrode 251 and the second type electrodes 252a and 252b of the micro light emitting device 200D may be combined with the metal layer 425 to face each other. When the micro light emitting device 200D is bonded to the drive circuit substrate 410, for example, a eutectic bonding method may be used.

A bonding material may spread during bonding, and the bonding spread prevention portions 262 and 263 may block spreading of the bonding material. Accordingly, it is possible to prevent a short circuit from occurring due to spread of a bonding material during bonding, and to reduce a bonding failure. A display apparatus including a micro light emitting device according to an example embodiment may increase a bonding margin even when a size of the micro light emitting device is reduced, and thereby, a high-resolution display apparatus may be provided.

Although the micro light emitting device 200D is described as an example in the present embodiment, a display apparatus may be implemented by applying micro light emitting devices according to various embodiments described with reference to FIGS. 1 to 24.

A method of manufacturing a micro light emitting device according to an example embodiment will be described hereinafter. FIGS. 26 to 33 illustrate a method of manufacturing a micro light emitting device according to an example embodiment.

Figure 26:
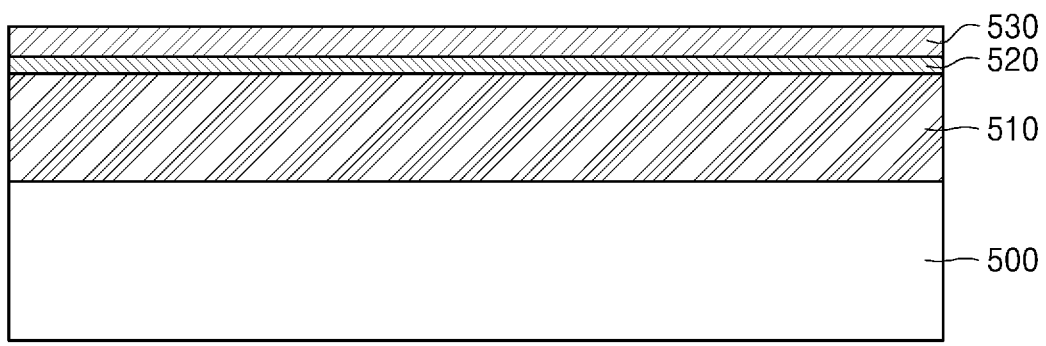
FIGS. 26 to 35 are views illustrating a method of manufacturing a micro light emitting device according to an example embodiment.

Referring to FIG. 26, a first type semiconductor layer 510, a light emitting layer 520, and a second type semiconductor layer 530 may be stacked on a substrate 500. The substrate 500 may include, for example, Si, SiC, sapphire ($Al_2O_3$), ZnO, GaAs, InP, or GaN and is not limited thereto.

The first type semiconductor layer 510 may include, for example, an n-type semiconductor. The first type semiconductor layer 510 may include a III-V group n-type semiconductor, for example, n-GaN. Alternatively, the first type semiconductor layer 510 may include an AlN layer or an $Al_xGa_{(1-x)}N$ ($0 \leq x \leq 1$) layer.

The light emitting layer 520 may have an MQW structure or a SQW structure. The light emitting layer 520 may include a III-V group semiconductor, for example, GaN. The light emitting layer 520 may have, for example, a MQW structure in which InGaN layers and GaN layers are alternately stacked.

The second type semiconductor layer 530 may include, for example, a p-type semiconductor layer. Alternatively, when the first type semiconductor layer 510 is p-type semiconductor layer, the second type semiconductor layer 530 may be an n-type semiconductor layer. The second type semiconductor layer 530 may include, for example, a GaN layer, an AlN layer, or an $Al_xGa_{(1-x)}N$ ($0 \leq x \leq 1$) layer.

Figure 27:
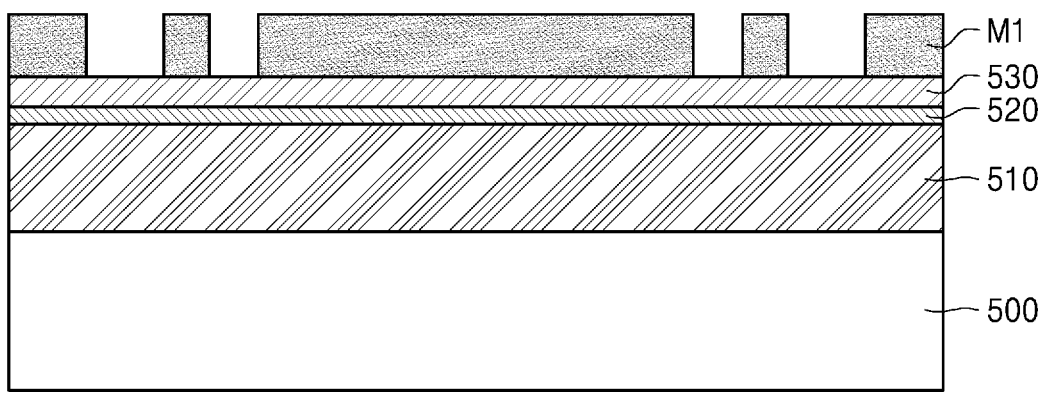
Figure 28:
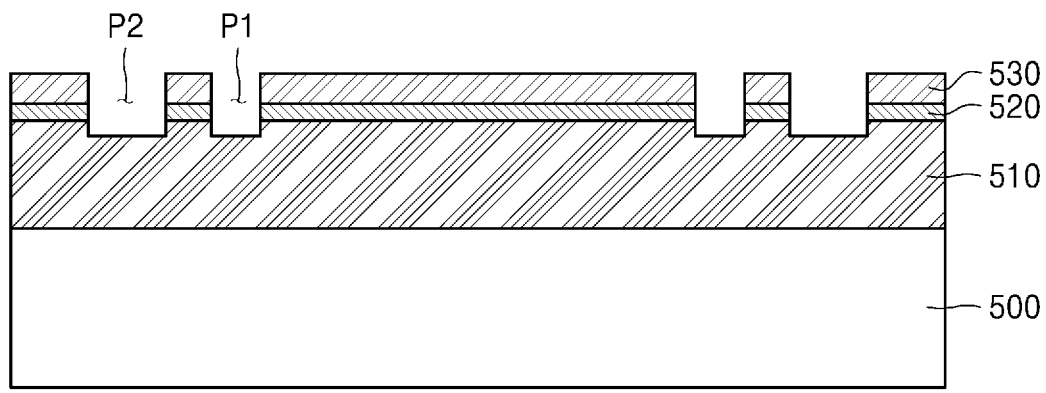

Referring to FIG. 27, a stacked structure illustrated in FIG. 26 may be patterned by using a first mask M1. The first mask M1 may include, for example, a photoresist. Referring to FIG. 28, a first pattern region P1 and a second pattern region P2 may be provided by etching a region patterned by the first mask M1. The first pattern region P1 and the second pattern region P2 may penetrate the second type semiconductor layer 530 and the light emitting layer 520 to extend to the first type semiconductor layer 510.

Figure 29:
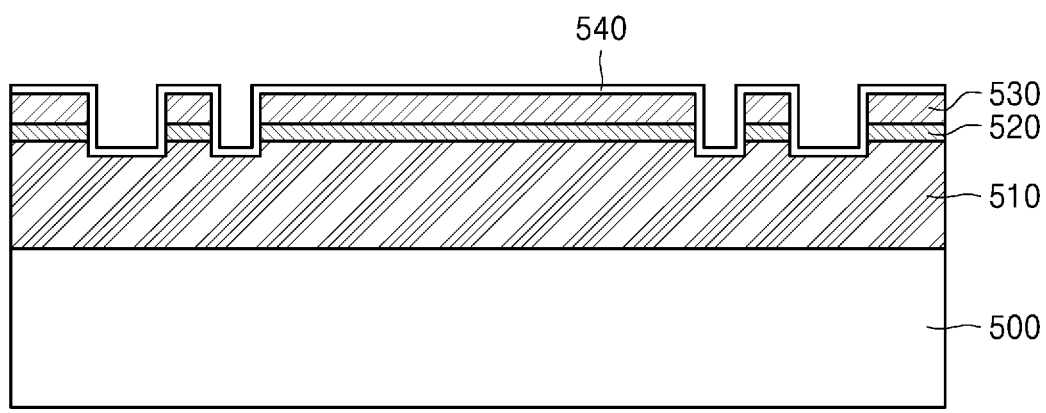
Figure 30:
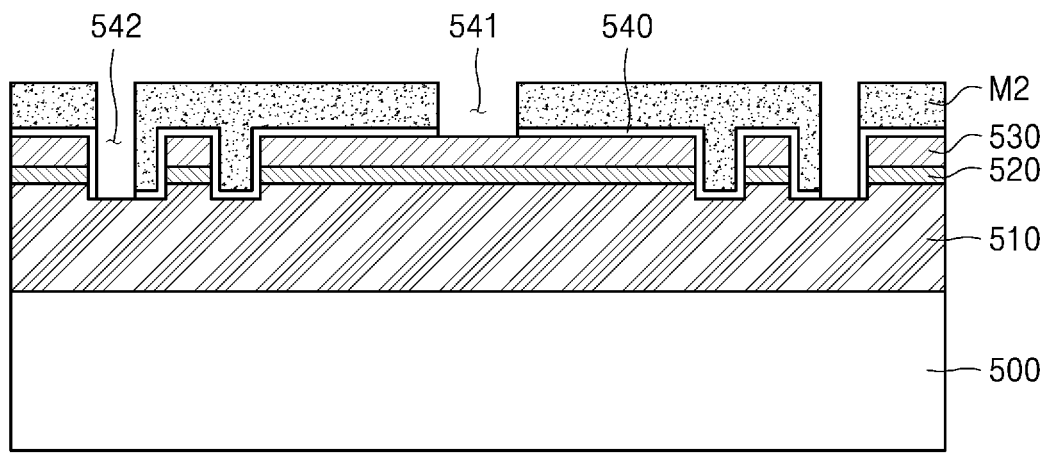

Referring to FIG. 29, an insulating layer 540 may be deposited on the second type semiconductor layer 530. The insulating layer 540 may be deposited up to the first pattern region P1 and the second pattern region P2. Referring to FIG. 30, a second mask M2 may be applied to the stacked structure illustrated in FIG. 28. The second mask M2 may include a pattern corresponding to a region to be etched. A third pattern region 541 exposing the first type semiconductor layer 510 and a fourth pattern region 542 exposing the second type semiconductor layer 530 may be provided by etching the insulating layer 540 by using the second mask M2.

Figure 31:
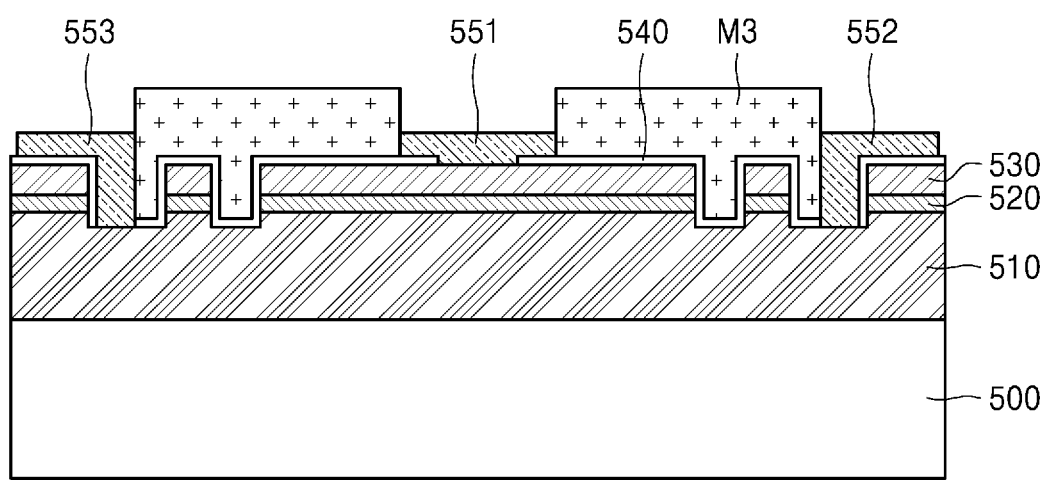

Referring to FIG. 31, a first type electrode 551 and second type electrodes 552 and 553 may be provided by depositing a metal layer by using a third mask M3. The first type electrode 551 may be provided in the third pattern region 541, and the second type electrodes 552 and 553 may be provided in the fourth pattern region 542. The first type electrode 551 may be connected to the second type semiconductor layer 530, and the second type electrodes 552 and 553 may be connected to the first type semiconductor layer 510. The fourth pattern region 542 may include a partial region of the second pattern region P2. However, the present disclosure is not limited thereto, and the fourth pattern region 542 may be the same as the second pattern region P2.

Figure 32:
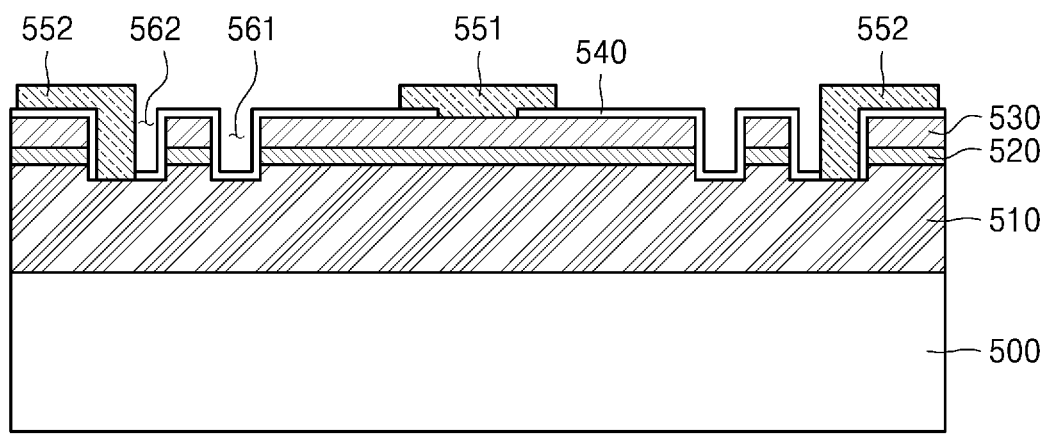

Referring to FIG. 32, when the third mask M3 is removed, a first bonding spread prevention portion 561 and a second bonding spread prevention portion 562 may be provided. The first bonding spread prevention portion 561 may be provided in the first pattern region P1, and the second bonding spread prevention portion 562 may be provided in a partial region of the second pattern region P2. Accordingly, the second bonding spread prevention portion 562 may be provided in contact with the second type electrodes 552 and 553. The first bonding spread prevention portion 561 and the second bonding spread prevention portion 562 may be configured by various combining a damper structure and a valley structure such as a hole, a trench, and a protruding dam.

Figure 33:
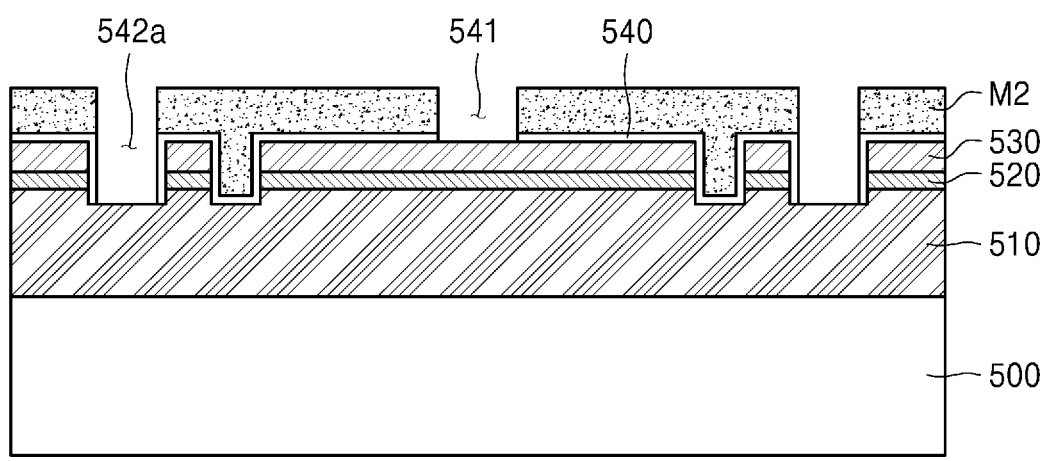
Figure 34:
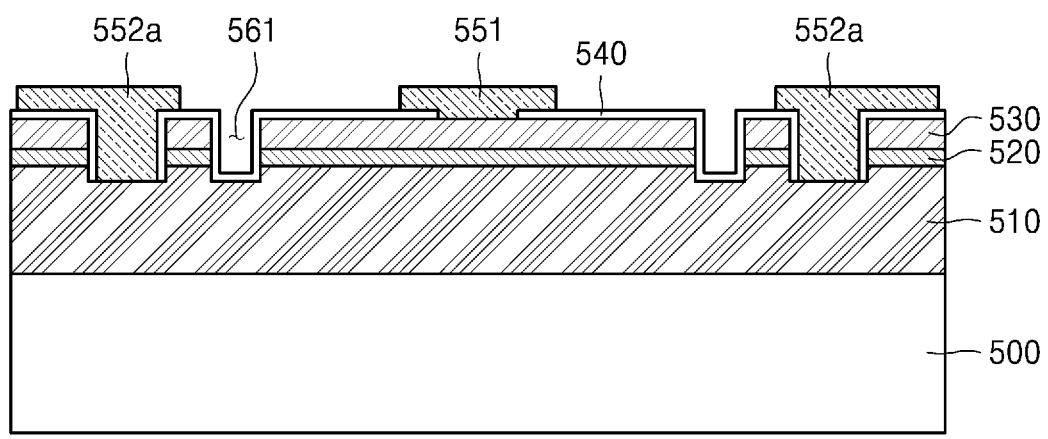

Although forming the fourth pattern region 542 in a partial region of the second pattern region is illustrated in FIG. 30, forming the fourth pattern region 542a in the entire region of the second pattern region. is possible as illustrated in FIG. 33. In this case, the first type semiconductor layer 510 may be exposed in an entire bottom surface of the fourth pattern region 542a. In addition, as illustrated in FIG. 34, the second type electrode 552a may be provided by depositing a metal layer on the fourth pattern region 542a. In the present embodiment, the second bonding spread prevention portion is not provided, and only the first bonding spread prevention portion 561 may be provided.

Figure 35:
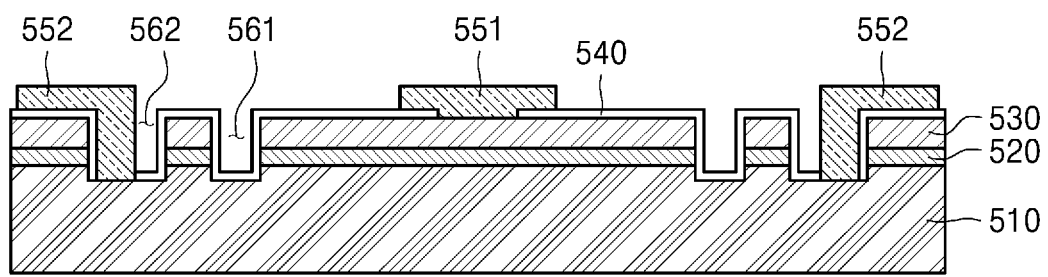

Referring to FIG. 35, the substrate 500 may be removed. For example, when the substrate 500 is a silicon substrate, the substrate 500 may be removed by using an etching solution such as KOH. For example, when the substrate 550 is a sapphire substrate, the substrate 550 may be removed by a laser lift-off method. By removing the substrate 500, the micro light emitting device may be separated as a chip unit. In this way, the micro light emitting devices separated as a chip unit may be transferred onto a transfer substrate. A dry transfer method such as pick and place, or a wet transfer method may be used as a transfer method. In addition, a display apparatus may be manufactured by combining a micro light emitting device with a drive circuit substrate.

Figure 36:
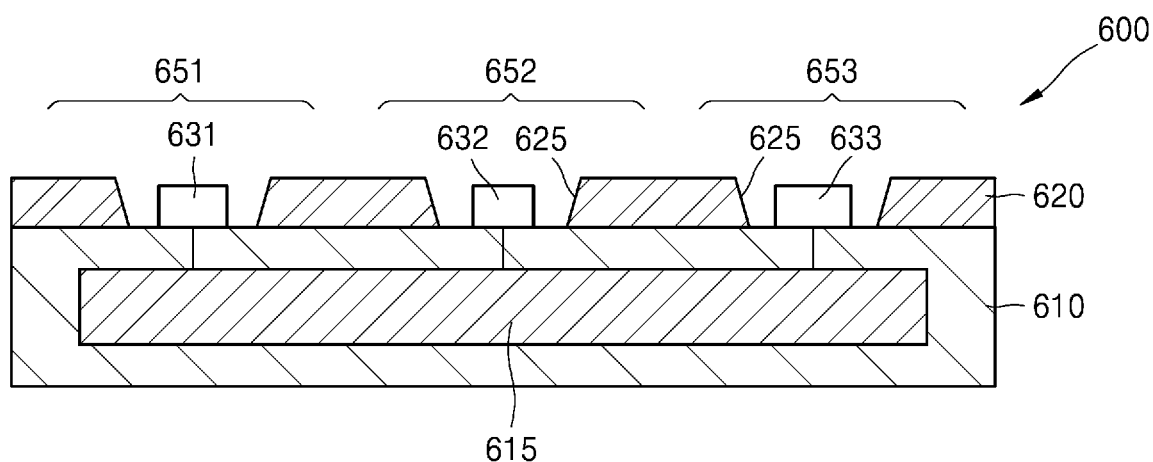
FIGS. 36 to 43 illustrate various examples of a display apparatus according to an example embodiment.

FIG. 36 is a view illustrating a display apparatus according to an example embodiment.

Referring to FIG. 36, a display apparatus 600 includes a drive circuit substrate 610 and at least one micro light emitting device connected to the drive circuit substrate 610. The at least one micro light emitting device may include, for example, a first micro light emitting device 631, a second micro light emitting device 632, and a third micro light emitting device 633. The micro light emitting devices described with reference to FIGS. 1 to 24 may be applied as the first micro light emitting device 631, the second micro light emitting device 632, and the third micro light emitting device 633.

The drive circuit substrate 610 may include at least one transistor and at least one capacitor that may drive the first micro light emitting device 631, the second micro light emitting device 632, and the third micro light emitting device 633. A layer 620 having grooves 625 may be further provided on the drive circuit substrate 610. The layer 620 may include, for example, a transfer mold or an insulating layer. The first micro light emitting device 631, the second micro light emitting device 632, and the third micro light emitting device 633 may be provided in the grooves 625, respectively. Here, an example in which the first micro light emitting device 631, the second micro light emitting device 632, and the third micro light emitting device 633 are provided in a grooved structure is illustrated, but the first micro light emitting device 631, the second micro light emitting device 632, and the third micro light emitting device 633 may be provided in the drive circuit substrate 610 without grooves, and an electrode structure according thereto may be variously implemented. When the layer 620 is a transfer mold, the first micro light emitting device 631, the second micro light emitting device 632, and the third micro light emitting device 633 are transferred onto the layer 620 coupled to the drive circuit substrate 610 and may be electrically connected as it is. Alternatively, when the layer 620 is an insulating layer, the first micro light emitting device 631, the second micro light emitting device 632, and the third micro light emitting device 633 are transferred onto, for example, the drive circuit substrate 610, and the layer 620 may be applied thereon.

In the present embodiment, the micro light emitting device may emit light of different colors for each sub-pixel. In this case, a color filter for filtering color light from a micro light emitting device may be further provided. For example, the first micro light emitting device 631 may emit first color light, the second micro light emitting device 632 may emit second color light, and the third micro light emitting device 633 may emit third color light. For example, the first color light may be blue light, the second color light may be green light, and the third color light may be red light. In this way, respective sub-pixels of a plurality of micro light emitting devices may emit color lights different from each other, thereby displaying an image. The display apparatus 600 according to the present example embodiment may be applied to a light emitting diode (LED) television, a digital signage, a mobile display apparatus, a wearable display apparatus, a virtual reality apparatus, an augmented reality apparatus, or the like.

Meanwhile, the first micro light emitting device 631, the second micro light emitting device 632, and the third micro light emitting device 633 may emit single color light.

Figure 37:
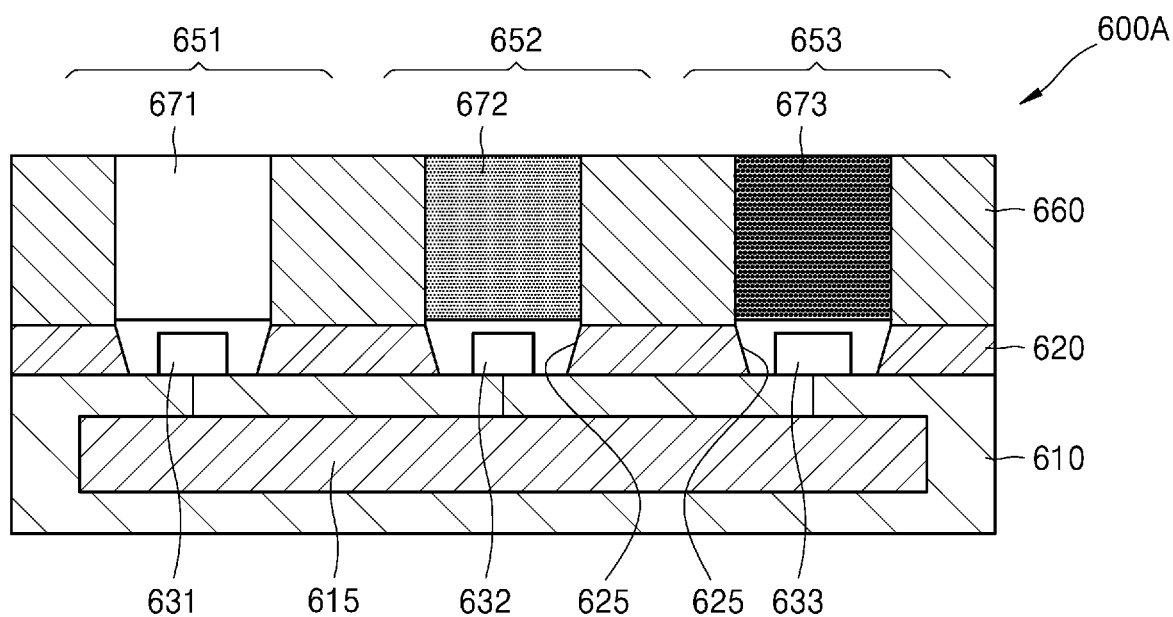

FIG. 37 illustrates an example in which a micro light emitting device emits single color light.

A display apparatus 600A may include a first sub-pixel 651, a second sub-pixel 652, and a third sub-pixel 653. Here, configuration elements denoted by the same reference numerals as in FIG. 34 have substantially the same functions and configurations as in FIG. 36, and thus, detailed descriptions thereof is omitted here.

The display apparatus 600A may further include, for example, partition walls 660 spaced apart from the layer 620 at a predetermined interval, and a color conversion layer between the partition walls 660. The color conversion layer may convert colors of light emitted from the first micro light emitting device 631, the second micro light emitting device 632, and the third micro light emitting device 633. The first micro light emitting device 631, the second micro light emitting device 632, and the third micro light emitting device 633 may emit first color light, for example, blue light. However, this is only an example, and the micro light emitting device may emit light having different wavelengths capable of exciting the color conversion layer.

The color conversion layer may include a first color conversion layer 671 for converting light from the first micro light emitting device 631 into first color light, a second color conversion layer 672 for converting light from the second micro light emitting device 632 into second color light, and a third color conversion layer 673 for converting light from the third micro light emitting device 633 into third color light. The second color light may be, for example, green light, and the third color light may be, for example, red light.

The first color conversion layer 671 may include, for example, a resin that passes light from the first micro light emitting device 631 therethrough. The second color conversion layer 672 may emit green light by blue light emitted from the second micro light emitting device 632. The second color conversion layer 672 may include quantum dots (QDs) of a predetermined size that are excited by blue light to emit green light. The quantum dots may each have a core-shell structure having a core portion and a shell portion and may also have a particle structure without a shell. The core-shell structure may have a single-shell or a multi-shell. The multi-shell may be, for example, a double-shell.

A quantum dot may include at least one of, for example, a II-VI group semiconductor, a III-V group semiconductor, a IV-VI group semiconductor, a IV group semiconductor, and a graphene quantum dot. The quantum dot may include at least one of, for example, Cd, Se, Zn, S, and InP, but is not limited thereto. The quantum dot may have a diameter less than or equal to several tens of nm, for example, a diameter of approximately 10 nm or less.

Alternatively, the second color conversion layer 672 may also include phosphor that is excited by blue light emitted from the second micro light emitting device 672 to emit green light.

The third color conversion layer 673 may change blue light emitted from the third micro light emitting device 633 into red light and emit the blue light. The third color conversion layer 673 may include quantum dots of a predetermined size that are excited by blue light to emit red light. Alternatively, the third color conversion layer 673 may also include phosphor that is excited by blue light emitted from the third micro light emitting device 633 and emits red light.

Figure 38:
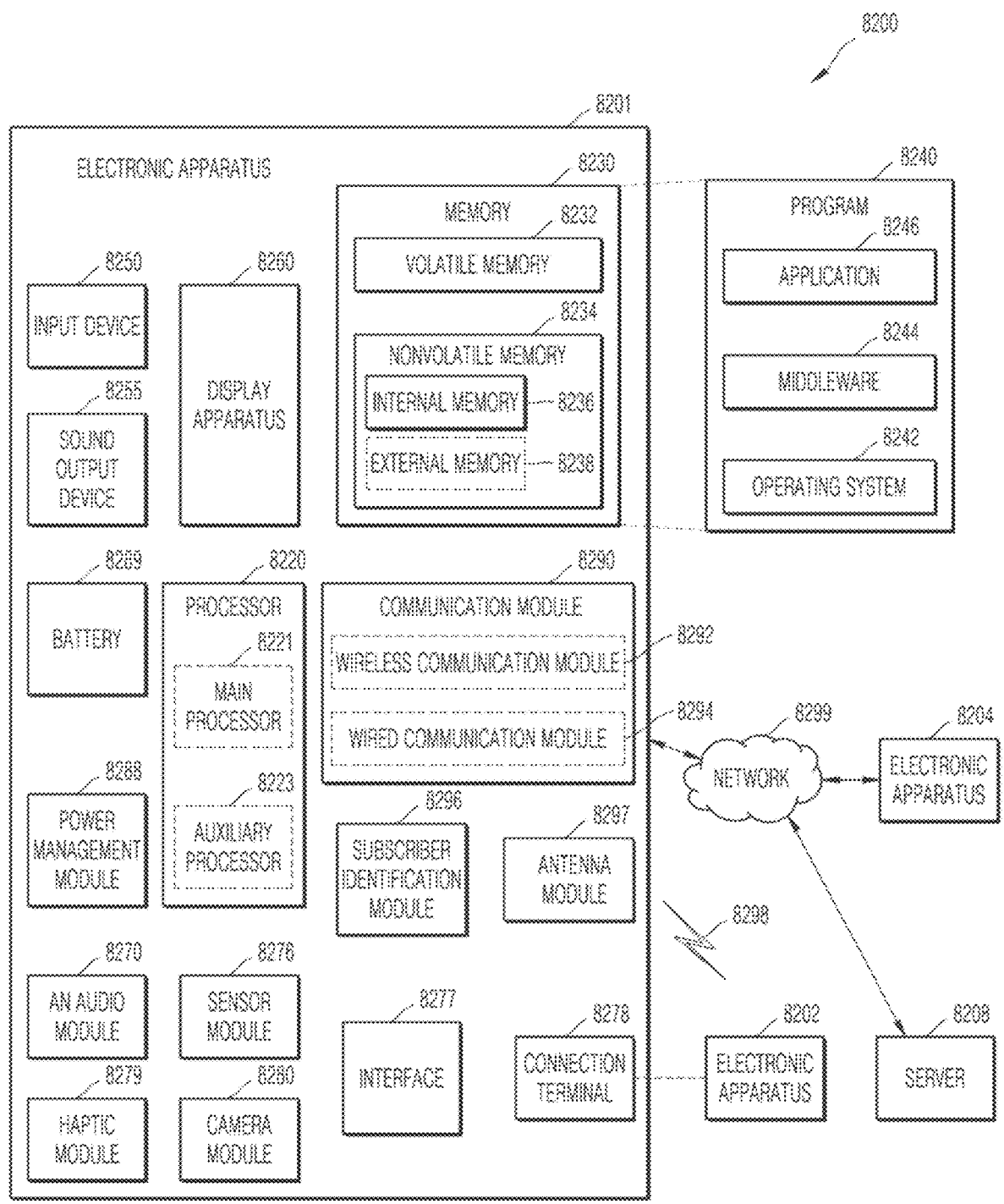

FIG. 38 is a block diagram of an electronic apparatus including a display apparatus, according to an example embodiment.

Referring to FIG. 38, an electronic apparatus 8201 may be included in a network environment 8200. In the network environment 8200, the electronic apparatus 8201 may communicate with another electronic apparatus 8202 through a first network 8298 (e.g., a short-range wireless communication network, or the like) or may communicate with another electronic apparatus 8204 and/or a server 8208 through a second network 8299 (e.g., long-range wireless communication network, or the like). The electronic apparatus 8201 may communicate with the electronic apparatus 8204 through the server 8208. The electronic apparatus 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of configuration elements of the electronic apparatus 8201 may be omitted or other configuration elements may be added to the electronic apparatus 8201. Some of the configuration elements may be implemented as one integrated circuit. For example, the sensor module 8276 (e.g., fingerprint sensor, iris sensor, illumination sensor, or the like) may be embedded in the display apparatus 8260 (e.g., display, or the like).

The processor 8220 may execute software (e.g., program 8240, or the like) to control one or a plurality of other configuration elements (e.g., hardware, software configuration elements, or the like) of the electronic apparatus 8201 connected to the processor 8220, and to perform various types of data processing or arithmetic. The processor 8220 may load commands and/or data received from other configuration elements (e.g., sensor module 8276, communication module 8290, or the like) in a volatile memory 8232, process the command and/or data stored in the volatile memory 8232, and store result data may in the nonvolatile memory 8234, as part of data processing or arithmetic. The processor 8220 may include a main processor 8221 (e.g., central processing unit, application processor, or the like) and an auxiliary processor 8223 (e.g., graphic processing unit, image signal processor, sensor hub processor, communication processor, or the like) that is operable independently or together therewith. The auxiliary processor 8223 may use less power than the main processor 8221 and may perform a specialized function.

The auxiliary processor 8223 may control functions and/or states related to some configuration elements (e.g., display apparatus 8260, sensor module 8276, communication module 8290, or the like) of the electronic apparatus 8201 instead of the main processor 8221 while the main processor 8221 is in an inactive state (sleep state), or together with the main processor 8221 while the main processor 8221 is in an active state (application execution state). The auxiliary processor 8223 (e.g., image signal processor, communication processor, or the like) may also be implemented as part of other functionally related configuration elements (e.g., camera module 8280, communication module 8290, or the like).

The memory 2230 may store various data required by configuration elements (e.g., processor 8220, sensor module 8276, or the like) of the electronic apparatus 8201. The data may include, for example, software (e.g., program 8240, or the like), input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used for configuration elements (e.g., processor 8220, or the like) of the electronic apparatus 8201 from the outside (e.g., user, or the like) of the electronic apparatus 8201. The input device 8250 may include a remote controller, a microphone, a mouse, a keyboard, and/or a digital pen (e.g., stylus pen, or the like).

The sound output device 8255 may output a sound signal to the outside of the electronic apparatus 8201. The sound output device 8255 may include a speaker and/or a receiver. The speaker may be used for general purposes such as multimedia playback or recording playback, and the receiver may be used to receive an incoming call. The receiver may be coupled as part of the speaker or may be implemented as an independent separate device.

The display apparatus 8260 may visually provide information to the outside of the electronic apparatus 8201. The display apparatus 8260 may include a display, a hologram apparatus, or a projector, and a control circuit for controlling the related apparatus. The display apparatus 8260 may include the micro light emitting device described with reference to FIGS. 1 to 24. The display apparatus 8260 may include a touch circuitry set to detect a touch, and/or a sensor circuit (e.g., pressure sensor, or the like) set to measure a strength of a force generated by the touch.

The audio module 8270 may convert sound into an electrical signal or may convert an electrical signal into sound. The audio module 8270 may acquire sound through the input device 8250, or may output sound through the sound output device 8255, and/or a speaker and/or a headphone of another electronic apparatus (e.g., electronic apparatus 8102, or the like) directly or wirelessly connected to the electronic apparatus 8201.

The sensor module 8276 may detect operation states (e.g., power, temperature, or the like) of the electronic apparatus 8201 or external environmental states (e.g., user state, or the like) and may generate an electrical signal and/or a data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for directly or wirelessly connecting the electronic apparatus 8201 to another electronic apparatus (e.g., electronic apparatus 8102, or the like). The interface 8277 may include a high definition multimedia interface (HDMI), a Universal Serial Bus (USB) interface, a secure digital (SD) card interface, and/or an audio interface.

A connection terminal 8278 may include a connector through which the electronic apparatus 8201 may be physically connected to another electronic apparatus (e.g., electronic apparatus 8102, or the like). The connection terminal 8278 may include a high-definition multimedia interface (HDMI) connector, a USB connector, an SD card connector, and/or an audio connector (e.g., headphone connector, or the like).

The haptic module 8279 may convert an electrical signal into mechanical stimulus (e.g., vibration, movement, or the like) or electrical stimulus that a user may perceive through a tactile sense or a movement sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic apparatus 8201. The power management module 8386 may be implemented as part of a power management integrated circuit (PMIC).

The battery 8289 may supply power to configuration elements of the electronic apparatus 8201. The battery 8289 may include a non-rechargeable primary cell, a rechargeable secondary cell, and/or a fuel cell.

The communication module 8290 may support establishment of a direct (wired) communication channel and/or a wireless communication channel between the electronic apparatus 8201 and other electronic apparatus (e.g., electronic apparatus 8102, electronic apparatus 8104, server 8108, or the like) and may support communication through the established communication channel. The communication module 8290 may be operated independently of the processor 8220 (e.g., application processor, or the like) and may include one or more communication processors supporting direct communication and/or wireless communication. The communication module 8290 may include a wireless communication module 8292 (e.g., cellular communication module, short-range wireless communication module, global navigation satellite system (GNSS) communication module, or the like) and/or a wired communication module 8294 (e.g., local area network (LAN) communication module, power line communication module, or the like). A related communication module among various communication modules may communicate with another electronic apparatus through a first network 8298 (e.g., a short-range communication network such as Bluetooth, Wi-Fi direct, or infrared data association (IrDA)) or a second network 8299 (e.g., cellular network, Internet, or computer network (e.g., local area network (LAN), wide area network (WAN), or the like), or the like). The various communication modules may be integrated into one configuration element (e.g., a single chip, or the like) or may be implemented as a plurality of separate configuration elements (multiple chips). The wireless communication module 8292 may check and authenticate the electronic apparatus 8201 in a communication network such as a first network 8298 and/or the second network 8299 by using subscriber information (e.g., international mobile subscriber identifier (IMSI), or the like) stored in the subscriber identification module 8296.

The antenna module 8297 may transmit a signal and/or power to the outside (e.g., another electronic apparatus, or the like) or may receive a signal and/or power from the outside. An antenna may include a radiator made of a conductive pattern provided on a substrate (e.g., PCB, or the like). The antenna module 8297 may include one or a plurality of antennas. When a plurality of antennas are included, an antenna suitable for a communication method used for a communication network such as the first network 8298 and/or the second network 8299 may be selected from among the plurality of antennas by the communication module 8290. Signals and/or power may be transmitted or received between the communication module 8290 and other electronic apparatuses through the selected antenna. In addition to the antenna, other components (e.g., radio frequency integrated circuit (RF IC), or the like) may be included as part of the antenna module 8297.

Part of the configuration elements may be connected to each other through a communication system (e.g., bus, general purpose input and output (GPIO), serial peripheral interface (SPI), mobile industry processor interface (MIPI), or the like) between peripheral devices) and may interchange signals (e.g., command, data, or the like).

Commands or data may be transmitted or received between the electronic apparatus 8201 and the external electronic apparatus 8204 through the server 8108 connected to the second network 8299. Other electronic apparatuses 8202 and 8204 may be the same apparatus as or different types of apparatuses from the electronic apparatus 8201. All or some of operations performed by the electronic apparatus 8201 may be performed by one or more of the other electronic apparatuses 8202 and 8204. For example, when the electronic apparatus 8201 is to perform a function or a service, the electronic apparatus 8201 may request one or more other electronic apparatuses to perform the function or part or all of the function or the service instead of performing the function or service by itself. One or more other electronic apparatuses that receive a request may perform an additional function or service related to the request and transmit a result of the performance to the electronic apparatus 8201. To this end, cloud computing, distributed computing, and/or client-server computing technology may be used.

Figure 39:
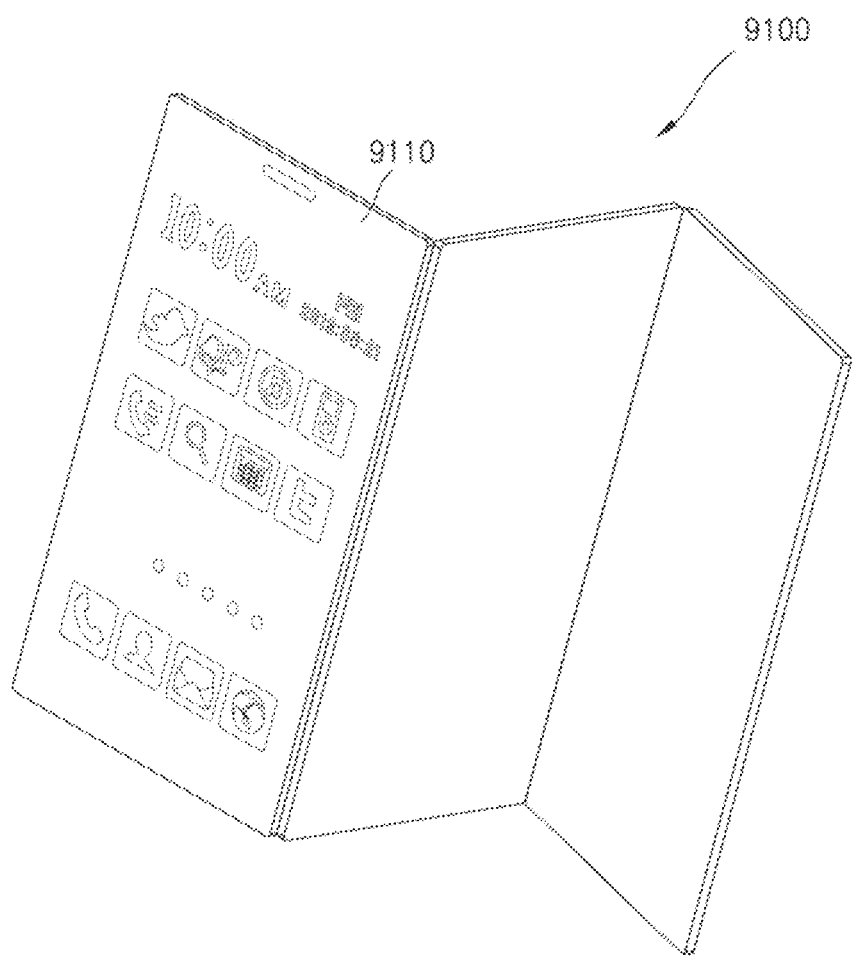

FIG. 39 illustrates an example in which an electronic apparatus according to an example embodiment is applied to a mobile device. A mobile device 9100 may include a display apparatus 9110 according to an example embodiment. The display apparatus 9110 may include the micro light emitting devices described with reference to FIGS. 1 to 24. The display apparatus 9110 may have a foldable structure and may be applied to, for example, a multi-folder display. Here, the mobile device 9100 is illustrated as a folder type display but may also be applied to a general flat panel display.

Figure 40:
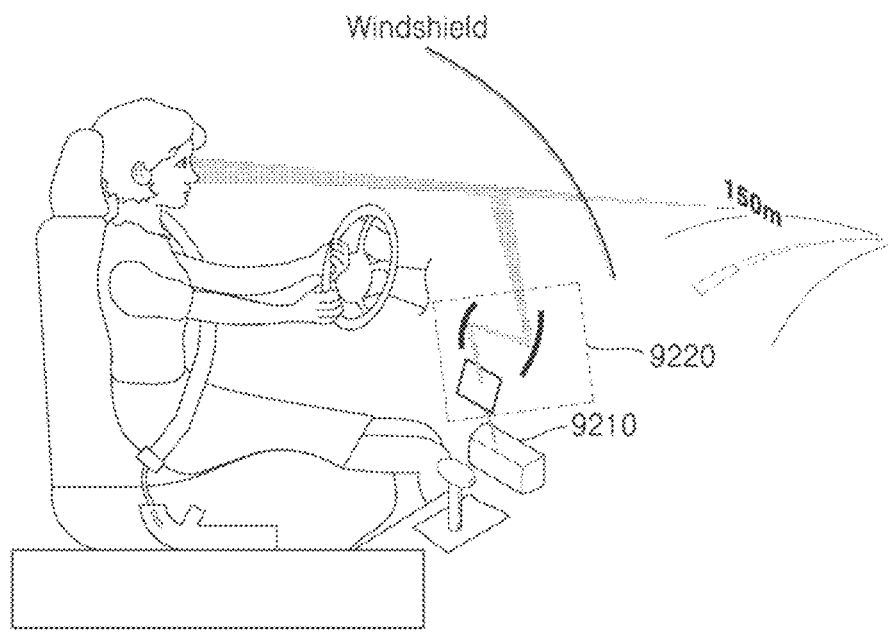

FIG. 40 illustrates an example in which a display apparatus according to an example embodiment is applied to a vehicle. The display apparatus may be applied to a head-up display apparatus for a vehicle. A head-up display apparatus 9200 may include a display apparatus 9210 provided in a region of the vehicle, and at least one light path changing member 9220 that converts a light path so that a driver may view an image generated by the display apparatus 9210.

Figure 41:
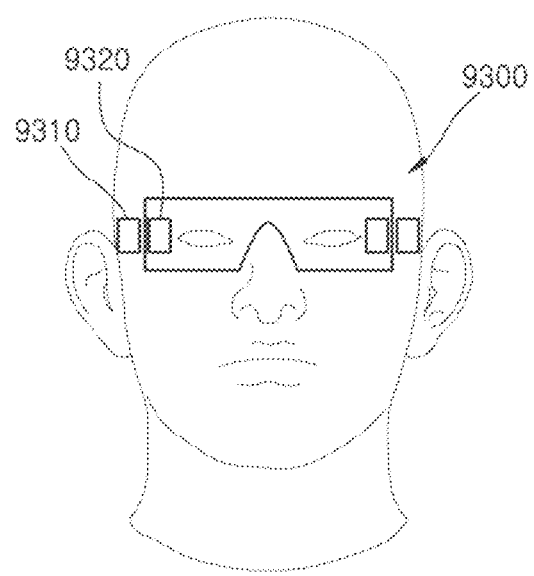

FIG. 41 illustrates an example in which a display apparatus according to an example embodiment is applied to augmented reality glasses or virtual reality glasses. An augmented reality glasses 9300 may include a projection system 9310 that forms an image, and at least one element 9320 that guide an image from the projection system 9310 to user's eyes. The projection system 9310 may include the micro light emitting devices described with reference to FIGS. 1 to 24.

Figure 42:
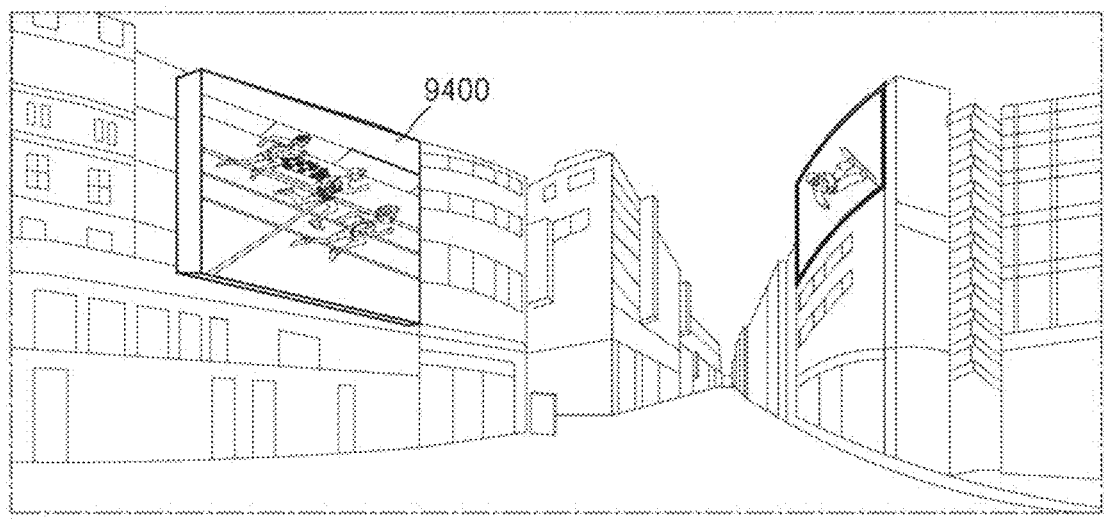

FIG. 42 illustrates an example in which a display apparatus according to an example embodiment is applied to a large-sized signage. A signage 9400 may be used for outdoor advertisement using a digital information display, and control content of advertisement through a communication network. The signage 9400 may be implemented through, for example, the electronic apparatus described with reference to FIG. 38.

Figure 43:
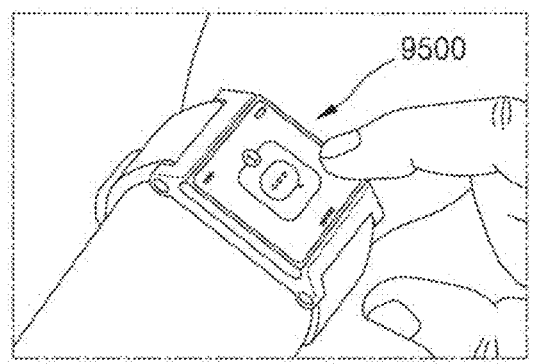

FIG. 43 illustrates an example in which a display apparatus according to an example embodiment is applied to a wearable display. A wearable display 9500 may include the micro light emitting devices described with reference to FIGS. 1 to 24 and may be implemented through the electronic apparatus described with reference to FIG. 38.

The display apparatus according to the example embodiment may be applied to an LED television, a mobile display, a smart watch, aggregated reality (AR) glasses, virtual reality (VR) glasses, a head-up display, or a signage. In addition, the display apparatus may be applied to various products such as a rollable television and a stretchable display.

The micro light emitting device according to the example embodiment may reduce a bonding failure when the micro light emitting device is bonded to a substrate. As a size of the micro light emitting device is reduced, a p-n short phenomenon may occur due to spreading of a bonding material during bonding, and the micro light emitting device according to the example embodiment has a structure capable of reducing a bonding failure.

The display apparatus may include a micro light emitting device and may reduce a repair rate by reducing a bonding failure of the micro light emitting device.

According to a method of manufacturing the display apparatus according to an example embodiment, a micro light emitting device display apparatus may be easily manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light emitting device comprising:
a first type semiconductor layer;
a light emitting layer provided on the first type semiconductor layer;
a second type semiconductor layer provided on the light emitting layer;
one or more first type electrodes provided on the second type semiconductor layer and comprising a first portion extending into the light emitting layer and the first type semiconductor layer;
second type electrodes provided on the second type semiconductor layer and spaced apart from the one or more first type electrodes;
an insulating layer comprising a first insulating portion provided directly between an upper surface of the second type semiconductor layer and a bottom portion of the one or more first type electrodes, a second insulating portion directly between the upper surface of the second type semiconductor layer and a bottom portion of the second type electrodes, and a third insulating portion directly between a side surface of the first portion of the one or more first type electrodes extending into the light emitting layer and the first type semiconductor layer, and the light emitting layer and the first type semiconductor layer; and
a bonding spread prevention portion provided between the one or more first type electrodes and the second type electrodes,
wherein the one or more first type electrodes is provided in a central region of the second type semiconductor layer, and the second type electrodes includes a first electrode and a second electrode provided symmetrically with respect to the one or more first type electrodes.

2. The micro light emitting device of claim 1, wherein the bonding spread prevention portion includes a valley structure or a damper structure.

3. The micro light emitting device of claim 1, wherein the bonding spread prevention portion includes a trench or a hole configured to guide a flow of a bonding material.

4. The micro light emitting device of claim 1, wherein the bonding spread prevention portion includes a protruding dam that is spaced apart from the one or more first type electrodes and the second type electrodes.

5. The micro light emitting device of claim 1, wherein the one or more first type electrodes is a p-type electrode, and the second type electrodes is an n-type electrode.

6. The micro light emitting device of claim 4, wherein the protruding dam is provided on an upper surface of the insulating layer.

7. A micro light emitting device comprising:
a first type semiconductor layer;
a light emitting layer provided on the first type semiconductor layer;

a second type semiconductor layer provided on the light emitting layer;

first type electrodes provided on the second type semiconductor layer and comprising a first portion extending into the light emitting layer and the first type semiconductor layer;

one or more second type electrodes provided on the second type semiconductor layer and spaced apart from the first type electrodes;

an insulating layer comprising a first insulating portion provided directly between an upper surface of the second type semiconductor layer and a bottom portion of the first type electrodes, a second insulating portion directly between the upper surface of the second type semiconductor layer and a bottom portion of the one or more second type electrodes, and a third insulating portion directly between a side surface of the first portion of the one or more first type electrodes extending into the light emitting layer and the first type semiconductor layer, and the light emitting layer and the first type semiconductor layer; and a first bonding spread prevention portion provided between the first type electrodes and the one or more second type electrodes, wherein the one or more second type electrodes is formed in a central region of the second type semiconductor layer, and the first type electrodes includes a first electrode and a second electrode provided symmetrically with respect to the one or more second type electrodes.

8. The micro light emitting device of claim 7, further comprising a second bonding spread prevention portion, wherein the first bonding spread prevention portion includes a protruding dam that is spaced apart from the first type electrodes and the one or more second type electrodes, and wherein the second bonding spread prevention portion includes a hole adjacent to the first type electrodes or the one or more second type electrodes.

9. The micro light emitting device of claim 7, wherein the first bonding spread prevention portion includes a hole adjacent to the first type electrodes or the one or more second type electrodes.

10. The micro light emitting device of claim 7, wherein the first type electrodes include the first electrode, the second electrode, a third electrode, and a fourth electrode provided symmetrically with respect to the one or more second type electrodes.

11. The micro light emitting device of claim 7, wherein a second or more bonding spread prevention portions are provided between the first type electrodes and the one or more second type electrodes.

12. The micro light emitting device of claim 7, wherein the micro light emitting device has a rectangular, circular, or polygonal cross-sectional shape.

13. A display apparatus comprising:
a drive circuit substrate including a drive circuit; and
a micro light emitting device provided on the drive circuit substrate,
wherein the micro light emitting device includes:
a first type semiconductor layer;
a light emitting layer provided on the first type semiconductor layer;
a second type semiconductor layer provided on the light emitting layer;
one or more first type electrodes provided on the second type semiconductor layer and comprising a first portion extending into the light emitting layer and the first type semiconductor layer;

second type electrodes provided on the second type semiconductor layer and spaced apart from the one or more first type electrodes;

an insulating layer comprising a first insulating portion provided directly between an upper surface of the second type semiconductor layer and a bottom portion of the one or more first type electrodes, a second insulating portion directly between the upper surface of the second type semiconductor layer and a bottom portion of the second type electrodes, and a third insulating portion directly between a side surface of the first portion of the one or more first type electrodes extending into the light emitting layer and the first type semiconductor layer, and the light emitting layer and the first type semiconductor layer; and a bonding spread prevention portion provided between the one or more first type electrodes and the second type electrodes, wherein the one or more first type electrodes is provided in a central region of the second type semiconductor layer, and the second type electrodes includes a first electrode and a second electrode provided symmetrically with respect to the one or more first type electrodes.

14. The display apparatus of claim 13, wherein the bonding spread prevention portion includes a valley structure or a damper structure.

15. The display apparatus of claim 13, wherein the bonding spread prevention portion includes a trench or a hole configured to guide a flow of a bonding material.

16. The display apparatus of claim 13, wherein the bonding spread prevention portion includes a protruding dam that is spaced apart from the one or more first type electrodes and the second type electrodes.

17. The display apparatus of claim 13, wherein the one or more first type electrodes is a p-type electrode, and the second type electrodes is an n-type electrode.

18. The display apparatus of claim 13, wherein the display apparatus is included in a light emitting diode (LED) television, a mobile display, a smart watch, aggregated reality (AR) glasses, virtual reality (VR) glasses, a head-up display, or a signage.

19. A display apparatus comprising:
a drive circuit substrate including a drive circuit; and
a micro light emitting device provided on the drive circuit substrate,
wherein the micro light emitting device includes:
a first type semiconductor layer;
a light emitting layer provided on the first type semiconductor layer;
a second type semiconductor layer provided on the light emitting layer;
first type electrodes provided on the second type semiconductor layer and comprising a first portion extending into the light emitting layer and the first type semiconductor layer;
one or more second type electrodes provided on the second type semiconductor layer and spaced apart from the first type electrodes;
an insulating layer comprising a first insulating portion provided directly between an upper surface of the second type semiconductor layer and a bottom portion of the first type electrodes, a second insulating portion directly between the upper surface of the second type semiconductor layer and a bottom portion of the one or more second type electrodes, and a third insulating portion directly between a side surface of the first portion of the first type electrodes extending into the light emitting layer and the first type semiconductor layer, and the light emitting layer and the first type semiconductor layer; and a first bonding spread prevention portion provided between the one or more first type electrodes and the one or more second type electrodes, wherein the one or more second type electrodes is provided in a central region of the second type semiconductor layer, and the first type electrodes includes a first electrode and a second electrode provided symmetrically with respect to the one or more second type electrodes.

20. The display apparatus of claim 19, further comprising a second bonding spread prevention portion, wherein the first bonding spread prevention portion includes a protruding dam that is spaced apart from the first type electrodes and the one or more second type electrodes, and wherein the second bonding spread prevention portion includes a hole adjacent to the first type electrodes or the one or more second type electrodes.

21. The display apparatus of claim 19, wherein the first bonding spread prevention portion includes a hole adjacent to the first type electrodes or the one or more second type electrodes.

22. The display apparatus of claim 19, wherein the first type electrodes include the first electrode, the second electrode, a third electrode, and a fourth electrode provided symmetrically with respect to the one or more second type electrodes.

23. The display apparatus of claim 19, wherein a second or more bonding spread prevention portions are provided between the first type electrodes and the one or more second type electrodes.

* * * * *